United States Patent
Tomizawa et al.

(10) Patent No.: US 8,557,948 B2
(45) Date of Patent: Oct. 15, 2013

(54) PHOTOSENSITIVE COMPOSITION, PHOTOSENSITIVE FILM, PHOTOSENSITIVE LAMINATE, METHOD OF FORMING A PERMANENT PATTERN, AND PRINTED BOARD

(75) Inventors: Hideki Tomizawa, Ashigarakami-gun (JP); Kazumori Minami, Ashigarakami-gun (JP); Daisuke Arioka, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 226 days.

(21) Appl. No.: 13/221,296

(22) Filed: Aug. 30, 2011

(65) Prior Publication Data
US 2012/0048594 A1 Mar. 1, 2012

(30) Foreign Application Priority Data
Aug. 31, 2010 (JP) ................. 2010-194713

(51) Int. Cl.
*C08G 65/08* (2006.01)
*C08G 65/14* (2006.01)

(52) U.S. Cl.
USPC ......... 528/100; 174/250; 430/284.1; 430/322

(58) Field of Classification Search
USPC ................ 174/250; 430/284.1, 322; 528/100
See application file for complete search history.

(56) References Cited

FOREIGN PATENT DOCUMENTS

| | | |
|---|---|---|
| JP | 2009-251585 A | 10/2009 |
| JP | 2009-271290 A | 11/2009 |
| JP | 2010-117452 A | 5/2010 |

*Primary Examiner* — Terressa Boykin
(74) *Attorney, Agent, or Firm* — Sughrue Mion, PLLC

(57) ABSTRACT

A photosensitive composition, at least containing: a carboxyl group-containing photosensitive polyurethane resin; a phosphorus-containing flame retardant; a polymerizable compound; and a photopolymerization initiator, wherein both a resin polymer of the photosensitive polyurethane resin and the polymerizable compound do not contain a phosphorus atom, wherein the photosensitive polyurethane resin has the weight average molecular weight from 2,000 to 60,000, the acid value from 20 mg KOH/g to 120 mg KOH/g, and the ethylenically unsaturated group equivalent from 0.05 mmol/g to 3.0 mmol/g, and wherein the photosensitive polyurethane resin has, in the side chain thereof, at least one particular functional group.

13 Claims, No Drawings

PHOTOSENSITIVE COMPOSITION, PHOTOSENSITIVE FILM, PHOTOSENSITIVE LAMINATE, METHOD OF FORMING A PERMANENT PATTERN, AND PRINTED BOARD

FIELD OF THE INVENTION

The present invention relates to a photosensitive composition suitable for use as a material for a solder resist, a photosensitive film, a photosensitive laminate, a method of forming a permanent pattern, and a printed board.

BACKGROUND OF THE INVENTION

Conventionally, a photosensitive film having a photosensitive layer formed by coating and drying a photosensitive composition on a support, has been used for forming a permanent pattern with a material, such as a solder resist. As a method of forming a permanent pattern with a material, such as a solder resist, hitherto, there is a method of forming a laminate by: laminating a photosensitive film on a substrate, such as a copper clad laminate, on which a permanent pattern is formed; exposing the photosensitive layer of the laminate; forming a pattern by developing the photosensitive layer after exposing it; and performing a hardening treatment, and the like.

For a photosensitive composition using a polyurethane resin as a binder for the solder resist, improving bending resistance and flame retardancy is an important task to be achieved, and various studies have been made in this regard.

For example, a photosensitive composition containing (A) an acid-modified and vinyl group-containing novolac type epoxy resin having a biphenyl skeleton, (B) a polyurethane resin, (C) a phosphorus-containing compound, (D) a photopolymerizable compound (D) having at least one ethylenically unsaturated group in the molecule, and (E) a photopolymerization initiator, in which (B) the polyurethane resin is a reaction product of an epoxy acrylate compound having an ethylenically unsaturated group and two or more hydroxyl groups, a diisocyanate compound, and a diol compound having a carboxyl group, is proposed. (see, for example, JP-A-2009-251585 ("JP-A" means unexamined published Japanese patent application)).

In addition, a photosensitive composition for a rigid printed wiring board containing a carboxyl group-containing photosensitive urethane resin (A), a photopolymerization initiator (B), an ethylenically unsaturated group-containing photosensitive compound (C), and a thermal hardening compound (D), in which the carboxyl group-containing photosensitive urethane resin (A) is a resin prepared by reacting a carboxyl group in a carboxyl group-containing urethane prepolymer (a) obtained by reacting a polymer polyol (e), a carboxylic acid compound (f) having two hydroxyl groups in the molecule, and a diisocyanate compound (g) as essential components, with an epoxy group or an oxetane group of a compound (b) having an epoxy group or an oxetane group and an ethylenically unsaturated group, and reacting a hydroxyl group in the resultant hydroxyl group-containing urethane prepolymer (c) with an acid anhydride group of an acid anhydride group-containing compound (d), is proposed (see, JP-A-2009-271290). In the examples of the publication of JP-A-2009-271290, a polyurethane resin added with a phosphazene compound or polyphosphoric acid melamine salt is described. Further, a photosensitive flame retardant resin composition in which the same urethane resin as the carboxyl group-containing photosensitive urethane resin described in JP-A-2009-271290 is combined with a specific amount of phosphinic acid salt having a specific volume average particle diameter is proposed (see, JP-A-2010-117452).

As described above, although it is required for a photosensitive composition used for a flexible printed circuit (FPC) to have excellent flame retardancy as well as excellent bending resistance, the flame retardancy and bending resistance are in the relationship of trade-off. Thus, there has not been developed yet a photosensitive composition having both of excellent flame retardancy and excellent bending resistance, and further having excellent resolution, excellent insulation reliability, and reduced warp (or bow), a photosensitive film and a photosensitive laminate, a method of forming a permanent pattern, and a printed board using the photosensitive composition.

SUMMARY OF THE INVENTION

The present invention resides in a photosensitive composition, at least containing:

a carboxyl group-containing photosensitive polyurethane resin;

a phosphorus-containing flame retardant;

a polymerizable compound; and a photopolymerization initiator, wherein both a resin polymer of the carboxyl group-containing photosensitive polyurethane resin and the polymerizable compound do not contain a phosphorus atom, wherein the carboxyl group-containing photosensitive polyurethane resin has the weight average molecular weight from 2,000 to 60,000, the acid value from 20 mg KOH/g to 120 mg KOH/g, and the ethylenically unsaturated group equivalent from 0.05 mmol/g to 3.0 mmol/g, wherein the carboxyl group-containing photosensitive polyurethane resin has, in the side chain thereof, at least one functional group represented by any one of formulae (1) to (3):

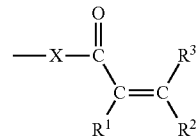

Formula (1)

in which $R^1$ to $R^3$ each independently represent a hydrogen atom or a substituent; X represents an oxygen atom, a sulfur atom, or $-N(R^{12})-$; and $R^{12}$ represents a hydrogen atom or a substituent;

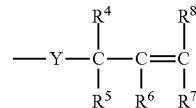

Formula (2)

in which $R^4$ to $R^8$ each independently represent a hydrogen atom or a substituent; Y represents an oxygen atom, a sulfur atom, or $-N(R^{12})-$; and $R^{12}$ has the same meaning as $R^{12}$ in formula (1); and Formula (1)

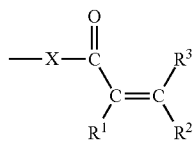

in which $R^1$ to $R^3$ each independently represent a hydrogen atom or a substituent; X represents an oxygen atom, a sulfur atom, or —N($R^{12}$)—; and $R^{12}$ represents a hydrogen atom or a substituent;

Formula (2)

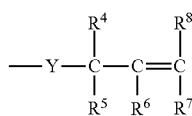

in which $R^4$ to $R^8$ each independently represent a hydrogen atom or a substituent; Y represents an oxygen atom, a sulfur atom, or —N($R^{12}$)—; and $R^{12}$ has the same meaning as $R^{12}$ in formula (1); and Formula (3)

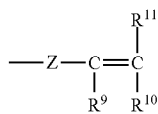

in which $R^9$ to $R^{11}$ each independently represent a hydrogen atom or a substituent; Z represents an oxygen atom, a sulfur atom, —N($R^{13}$)—, or a phenylene group which may have a substituent; and $R^{13}$ represents an alkyl group which may have a substituent; and wherein the at least one functional group represented by any one of formulae (1) to (3) does not link to a carbonyloxy-aliphatic group A (*) in a partial structure of the side chain, which partial structure links the group of any one of formulae (1) to (3) to the main chain of said polyurethane at the X, Y, or Z side, said carbonyloxy-aliphatic group A having a hydroxyl group or an acyloxy group substituted at the β position or γ position to the X, Y, or Z in an aliphatic moiety of the carbonyloxy-aliphatic group A and being linked to the structure of any one of formulae (1) to (3) which exists at the aliphatic moiety side (*) in the carbonyloxy-aliphatic group A.

<2> The photosensitive composition described in the above item <1>, wherein the carboxyl group-containing photosensitive polyurethane resin is a reaction product of a diisocyanate compound and a diol compound, and the diol compound is a mixture of (i) at least one diol compound having an ethylenically unsaturated group in which at least one hydroxyl group is a secondary alcohol and the remaining hydroxyl group is a primary or a tertiary alcohol, and (ii) at least one diol compound having a carboxyl group.

<3> The photosensitive composition described in the above item <2>, wherein the diol compound having an ethylenically unsaturated group has a hydroxyl group of primary alcohol and a hydroxyl group of secondary alcohol, as a hydroxyl group which is allowed to react with an isocyanate group.

<4> The photosensitive composition described in the above item <2> or <3>, wherein the diol compound having an ethylenically unsaturated group is a compound represented by formula (G):

---

Formula (3)

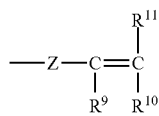

in which $R^9$ to $R^{11}$ each independently represent a hydrogen atom or a substituent; Z represents an oxygen atom, a sulfur atom, —N($R^{13}$)—, or a phenylene group which may have a substituent; and $R^{13}$ represents an alkyl group which may have a substituent; and wherein the at least one functional group represented by any one of formulae (1) to (3) does not link to a carbonyloxy-aliphatic group A (*) in a partial structure of the side chain, which partial structure links the group of any one of formulae (1) to (3) to the main chain of said polyurethane at the X, Y, or Z side, said carbonyloxy-aliphatic group A having a hydroxyl group or an acyloxy group substituted at the β position or γ position to the X, Y, or Z in an aliphatic moiety of the carbonyloxy-aliphatic group A and being linked to the structure of any one of formulae (1) to (3) which exists at the aliphatic moiety side (*) in the carbonyloxy-aliphatic group A.

Further, the present invention resides in a photosensitive film, having a photosensitive layer containing the photosensitive composition described above, on a support.

Further, the present invention resides in a photosensitive laminate, having:
 a substrate; and
 a photosensitive layer containing the photosensitive composition described above, provided on the substrate.

Further, the present invention resides in a method of forming a permanent pattern, at least comprising:
 exposing a photosensitive layer formed with the photosensitive composition described above, to light.

Furthermore, the present invention resides in a printed board, which has a permanent pattern formed according to the method of forming a permanent pattern described above.

Other and further features and advantages of the present invention will appear more fully from the following description.

DETAILED DESCRIPTION OF THE INVENTION

According to the present invention, there is provided the following means:
<1> A photosensitive composition, at least containing:
 a carboxyl group-containing photosensitive polyurethane resin;
 a phosphorus-containing flame retardant;
 a polymerizable compound; and
 a photopolymerization initiator,
 wherein both a resin polymer of the carboxyl group-containing photosensitive polyurethane resin and the polymerizable compound do not contain a phosphorus atom,
 wherein the carboxyl group-containing photosensitive polyurethane resin has the weight average molecular weight from 2,000 to 60,000, the acid value from 20 mg KOH/g to 120 mg KOH/g, and the ethylenically unsaturated group equivalent from 0.05 mmol/g to 3.0 mmol/g,
 wherein the carboxyl group-containing photosensitive polyurethane resin has, in the side chain thereof, at least one functional group represented by any one of formulae (1) to (3):

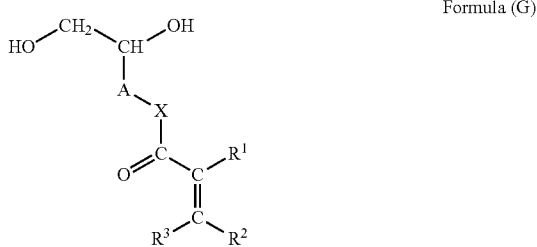

Formula (G)

wherein $R^1$ to $R^3$ each independently represent a hydrogen atom or a substituent; A represents a divalent organic residue; X represents an oxygen atom, a sulfur atom, or —N($R^{12}$)—; and $R^{12}$ represents a hydrogen atom or a substituent.

<5> The photosensitive composition described in any one of the above items <2> to <4>, wherein the diisocyanate compound is an aromatic compound.

<6> The photosensitive composition described in any one of the above items <2> to <5>, wherein the diisocyanate compound is a diisocyanate compound having a skeleton of bisphenol A type, bisphenol F type, biphenyl type, naphthalene type, phenanthrene type, or anthracene type.

<7> The photosensitive composition described in any one of the above items <1> to <6>, wherein the phosphorus-containing flame retardant is any one of condensed phosphoric acid compound, polyphosphoric melamine salt, phosphazene compound, and metal phosphate.

<8> The photosensitive composition described in any one of the above items <1> to <7>, which contains a thermo-crosslinking agent.

<9> The photosensitive composition described in the above item <8>, wherein the thermo-crosslinking agent is at least one selected from the group consisting of an epoxy compound, an oxetane compound, a polyisocyanate compound, a compound obtained by a reaction of a polyisocyanate compound with a blocking agent, and a melamine derivative.

<10> A photosensitive film, having a photosensitive layer containing the photosensitive composition described in any one of the above items <1> to <9>, on a support.

<11> A photosensitive laminate, having:
a substrate; and
a photosensitive layer containing the photosensitive composition described in any one of the above items <1> to <9>, provided on the substrate.

<12> A method of forming a permanent pattern, at least comprising:
exposing a photosensitive layer formed with the photosensitive composition described in any one of the above items <1> to <9>, to light.

<13> A printed board, which has a permanent pattern formed according to the method of forming a permanent pattern described in the above item <12>.

ADVANTAGEOUS EFFECTS OF INVENTION

The present invention can provide a photosensitive composition with excellent bending resistance, excellent flame retardancy, excellent resolution, excellent insulation reliability, and reduced warp, as well as a photosensitive film, a photosensitive laminate, a method of forming a permanent pattern, and a printed board, each utilizing the photosensitive composition.

MODES FOR CARRYING OUT THE INVENTION (Photosensitive Composition)

The photosensitive composition of the present invention contains at least a carboxyl group-containing photosensitive polyurethane resin, a phosphorus-containing flame retardant, a polymerizable compound, and a photopolymerization initiator. The photosensitive composition of the present invention may contain a thermo-crosslinking agent, a thermoplastic elastomer, and other components.

<Carboxyl Group-Containing Photosensitive Polyurethane Resin>

The carboxyl group-containing photosensitive polyurethane resin used in the present invention does not contain a phosphorus atom in the polyurethane resin polymer. Preferably, the polyurethane resin polymer consists of atoms selected from a carbon atom, a hydrogen atom, an oxygen atom, and a nitrogen atom.

The carboxyl group-containing photosensitive polyurethane resin used in the present invention has, as an ethylenically unsaturated group, at least one functional group represented by any one of formulae (1) to (3), in the side chain of the polymer.

In the present invention, the side chain indicates a chain branched from a chain of atoms which constitute the main chain of the polyurethane resin or a chain linked to the atoms which constitute the main chain through substitution. Having an ethylenically unsaturated group in the side chain means that an ethylenically unsaturated group is contained in the side chain or an ethylenically unsaturated group is directly substituted on the atoms which constitute the main chain. For example, the polyurethane resin obtained only from the reaction between diol of HOCH$_2$CH=CHCH$_2$OH and OCN(CH$_2$)$_6$NCO has an ethylenically unsaturated group in the main chain. Further, in the present invention, although an ethylenically unsaturated group may be present at the polymer terminal of the main chain of a polyurethane resin. In the present invention, the ethylenically unsaturated group present at the polymer terminal is not an ethylenically unsaturated group present at a side chain.

Further, an ethylenically unsaturated group indicates a group having an ethylene group that is consumed during measurement of bromine number or iodine number, and it does not indicate an aromatic group like benzene. The ethylenically unsaturated group is preferably a vinyl group which may have a substituent group.

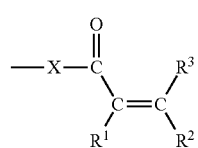

Formula (1)

In formula (1), $R^1$ to $R^3$ each independently represent a hydrogen atom or a substituent. Herein, examples of the substituent include a halogen atom, an alkyl group, an alkenyl group, an alkynyl group, a cycloalkyl group, a cycloalkenyl group, an aryl group, a heterocyclic group, an alkoxy group, an aryloxy group, an alkylthio group, an arylthio group, an amino group, an alkylamino group, an arylamino group, an acylamino group, a sulfonamido group, an alkyl- or arylsulfonyl group, an alkyl- or aryl-sulfinyl group, an alkoxycarbonyl group, an aryloxycarbonyl group, an acyl group, an acyloxy group, a carbamoyl group, a sulfamoyl group, a hydroxyl group, a mercapto group, a cyano group, a nitro group, a carboxyl group, a sulfo group, a ureido group and a urethane group. These groups may be also substituted by the substituent described above. Further, the same substituent can be employed on the substituent for each formula described below and the substituent which may be substituted with each group described below.

$R^1$ is preferably a hydrogen atom, or an alkyl group which may have a substituent. Among these, a hydrogen atom and a methyl group are more preferred in view of high radical reactivity.

$R^2$ and $R^3$ each are preferably a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, or an arylsulfonyl group which may have a substituent. Among these, a hydrogen atom, a carboxyl group, an alkoxycarbonyl group, an alkyl group which may have a substituent, and an aryl group which may have a substituent are more preferable in view of high radical reactivity.

In formula (1), X represents an oxygen atom, a sulfur atom, or $—N(R^{12})—$, and $R^{12}$ represents a hydrogen atom or a substituent. $R^{12}$ is preferably an alkyl group which may have a substituent. Among these, a hydrogen atom, a methyl group, an ethyl group, and an isopropyl group are more preferable in view of high radical reactivity.

Herein, examples of the substituent which can be introduced include those exemplified for $R^1$ to $R^3$, and preferred examples thereof include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amide group, an alkylsulfonyl group, and an arylsulfonyl group.

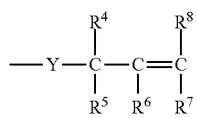

Formula (2)

In formula (2), $R^4$ to $R^8$ each independently represent a hydrogen atom or a substituent. $R^4$ to $R^8$ each preferably represent a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, or an arylsulfonyl group which may have a substituent. Among these, a hydrogen atom, a carboxyl group, an alkoxycarbonyl group, an alkyl group which may have a substituent, and an aryl group which may have a substituent are more preferable in view of high radical reactivity.

Examples of the substituent which can be introduced are the same as those for formula (I).

Y represents an oxygen atom, a sulfur atom, or $—N(R^{12})—$. $R^{12}$ is the same as $R^{12}$ in formula (1) and preferred examples thereof are also the same.

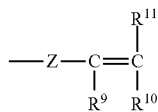

Formula (3)

In formula (3), $R^9$ to $R^{11}$ each independently represent a hydrogen atom or a substituent.

Examples of $R^9$ preferably include a hydrogen atom, and an alkyl group which may have a substituent. Among these, a hydrogen atom and a methyl group are preferred in view of high radical reactivity.

$R^{10}$ and $R^{11}$ each independently represent, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent an alkoxy group which may have a substituent, an aryloxy group which may have a substituent, an alkylamino group which may have a substituent, an arylamino group which may have a substituent, an alkylsulfonyl group which may have a substituent, or an arylsulfonyl group which may have a substituent. Among these, a hydrogen atom, a carboxyl group, an alkoxycarbonyl group, an alkyl group which may have a substituent, and an aryl group which may have a substituent are preferred in view of high radical reactivity.

Herein, examples of the substituent which can be introduced are the same as those for formula (1).

Z represents an oxygen atom, a sulfur atom, $—N(R^{13})—$, or a phenylene group which may have a substituent. $R^{13}$ represents a hydrogen atom or a substituent, and preferably, an alkyl group which may have a substituent. Among these, a methyl group, an ethyl group, and an isopropyl group are preferred in view of high radical reactivity.

Among the functional groups represented by any one of formula (1) to (3), the functional group represented by formula (1) and the functional group represented by formula (3) are preferable. The functional group represented by formula (1) is more preferable. Specific examples of the preferred group include, from the viewpoint of formability of a crosslinked and cured film, a methacryloyl group, an acryloyl group, and a styryl group. More preferred examples thereof include a methacryloyl group and an acryloyl group. From the viewpoint of formability of a crosslinked and cured film and raw-stability storability, a methacryloyl group is particularly preferable.

Regarding the carboxyl group-containing photosensitive polyurethane resin used in the present invention, an ethylenically unsaturated group is not introduced by allowing a reaction of a carboxyl group-containing polyurethane resin with a compound having an epoxy group or an oxetane group and an ethylenically unsaturated group in the molecule. Thus, the group represented by any one of formulae (1) to (3) does not link to the carbonyloxy-aliphatic group A. Herein, the carbonyloxy-aliphatic group A is represented by —C(O)—O-(a divalent aliphatic group)- (*), in which a hydroxyl group or an acyloxy group is substituted at the β position or γ position, and the structure of the group represented by any one of formulae (1) to (3) is present at the (*) side, i.e. the aliphatic moiety side but not the carbonyloxy moiety side, of the group —C(O)—O-(a divalent aliphatic group)-. The carbonyloxy-aliphatic group A constitutes the partial structure of the side chain, by which the group represented by any one of formulae (1) to (3) is linked to the main chain of the polyurethane at the X, Y, or Z side of the group represented by any one of formulae (1) to (3). Further, regarding the β position and γ position, the β position is the carbon atom bonded to the carbon atom (α position) substituted by an oxygen atom (i.e. the divalent oxy group) of the carbonyloxy moiety in the carbonyloxy-aliphatic group A, and the γ position is the carbon atom bonded to the carbon atom at the β position.

In other words, the partial structure of the side chain is not the carbonyloxy-aliphatic group A (*). The side chain includes the at least one functional group represented by any of formula (1), (2), and (3) as the terminal group. The carbonyloxy-aliphatic group A (*) is a linking group which links the at least one functional group represented by any of formula (1), (2), and (3) to the main chain of the polyurethane resin polymer of the carboxyl group-containing photosensitive polyurethane resin, directly or indirectly via another linking moiety.

The carboxyl group-containing photosensitive polyurethane resin to which an ethylenically unsaturated group is introduced by reacting a carboxyl group-containing polyurethane resin with a compound having an epoxy group or an oxetane group and an ethylenically unsaturated group in the molecule is not appropriate in that a hydroxyl group may be easily generated by hydrolysis, etc. after the reaction, causing a decrease in insulation reliability.

The carboxyl group-containing photosensitive polyurethane resin used in the present invention is a polyurethane resin having a basic skeleton including a structural unit which is a reaction product of at least one diisocyanate compound represented by formula (4) and at least one diol compound represented by formula (5).

OCN—X⁰—NCO                    Formula (4)

HO—Y⁰—OH                      Formula (5)

In formulae (4) and (5), $X^0$ and $Y^0$ each independently represent a divalent organic residue (linking group).

When at least either one of the diisocyanate compound represented by formula (4) or the diol compound represented by formula (5) contains at least one group represented by any one of formulae (1) to (3), a polyurethane resin having at least one group represented by any one of formulae (1) to (3) which is introduced into the side chain thereof is produced as a reaction product of the diisocyanate compound and the diol compound. According to the above method, the polyurethane resin for use in the present invention can be more easily produced than when a desired side chain is substituted or introduced after the production of a polyurethane resin.

The diisocyanate compound represented by formula (4) is not particularly limited and may be suitably selected in accordance with the intended use. Examples thereof include reaction products obtained by addition-reacting, for example, a triisocyanate compound with one equivalent of a monofunctional alcohol or monofunctional amine compound having an unsaturated group.

The triisocyanate compound mentioned above is not specifically limited and it may be suitably selected in accordance with the intended use. Examples thereof include the compounds described in paragraph [0034] and [0035] of JP-A-2005-250438.

The monofunctional alcohol or monofunctional amine compound having an unsaturated group is not particularly limited and may be suitably selected in accordance with the intended use. Examples thereof include the compounds described in paragraph [0037] to [0040] of JP-A-2005-250438.

The method of introducing an unsaturated group into the side chain of the polyurethane resin is not particularly limited and may be suitably selected in accordance with the intended use. However, a method where a diisocyanate compound containing an unsaturated group in the side chain is used as a raw material in the preparation of the polyurethane resin is preferred. Examples of the diisocyanate compound, which can be obtained by the addition-reaction of a triisocyanate compound with one equivalent of a monofunctional alcohol or monofunctional amine compound having an unsaturated group, include, compounds having an unsaturated group in the side chain as described in paragraphs [0042] to [0049] of JP-A-2005-250438, for example.

In the carboxyl group-containing photosensitive polyurethane resin used in the present invention, a diisocyanate compound other than the above-described diisocyanate compound having an unsaturated group may be copolymerized, from the standpoint of elevating compatibility with other components in the polymerizable composition and enhancing the storage stability.

The diisocyanate compound which is copolymerized is not particularly limited and may be suitably selected in accordance with the intended use. Examples of the diisocyanate compound include a diisocyanate compound represented by formula (6).

OCN-L¹-NCO                    Formula (6)

In formula (6), $L^1$ represents a divalent aliphatic or aromatic hydrocarbon group which may have a substituent. $L^1$ may contain another functional group which does not react with the isocyanate group, such as an ester group, a urethane group, an amide group, and a ureido group.

Specific examples of the diisocyanate compound represented by formula (6) include aromatic diisocyanate compounds such as 2,4-tolylene diisocyanate, dimerized 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate, 3,3'-dimethylbiphenyl-4,4'-diisocyanate, and the like; aliphatic diisocyanate compounds such as hexamethylene diisocyanate, trimethylhexamethylene diisocyanate, lysine diisocyanate, dimeric acid diisocyanate, and the like; alicyclic diisocyanate compounds such as isophorone diisocyanate, 4,4'-methylenebis(cyclohexylisocyanate), methylcyclohexane-2,4(or 2,6)-diisocyanate, 1,3-(isocyanatomethyl)cyclohexane, and the like; and diisocyanate compounds which are a reaction product of a diol with a diisocyanate, such as an adduct of 1 mole of 1,3-butylene glycol and 2 moles of tolylene diisocyanate, and the like; and others.

The diisocyanate compound represented by formula (6) is preferably a diisocyanate compound having a skeleton of bisphenol A type, bisphenol F type, biphenyl type, naphthalene type, phenanthrene type, or anthracene type.

The diol compound represented by formula (5) above is not particularly limited and may be suitably selected in accordance with the intended use. Examples thereof include polyether diol compounds, polyester diol compounds, and polycarbonate diol compounds.

Here, as for the method of introducing an unsaturated group into the side chain of the polyurethane resin, in addition to the method described above, a method where a diol compound containing an unsaturated group in the side chain is used as a raw material in the production of the polyurethane resin is preferred. This diol compound containing an unsaturated group in the side chain may be, for example, a commercially available product such as trimethylolpropane monoallyl ether, or a compound easily produced by the reaction of a halogenated diol compound, a triol compound, or an aminodiol compound with a carboxylic acid, an acid chloride, an isocyanate, an alcohol, an amine, a thiol, or a halogenated alkyl compound having an unsaturated group.

As for the diol compound having an ethylenically unsaturated group, there is a compound in which both two hydroxyl groups which react with an isocyanate group is primary alcohol, a compound in which at least one hydroxyl group is secondary alcohol, and a compound in which both hydroxyl groups are secondary alcohol. Of these, a compound in which at least one of the two hydroxyl groups is secondary alcohol is preferable. The compound in which one hydroxyl group is secondary alcohol and the other hydroxyl group is primary alcohol is more preferable.

Preferred diol compound in which both two hydroxyl groups are of a primary alcohol is represented by any one of formulae (A1) to (E).

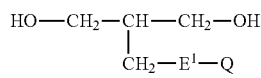

Formula (A1)

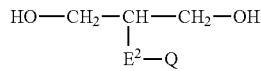

Formula (A2)

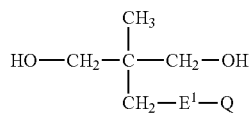

Formula (B)

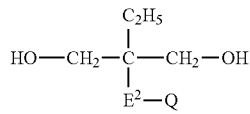

Formula (C)

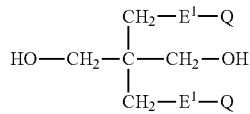

Formula (D)

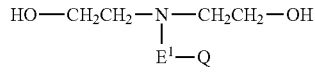

Formula (E)

In formulae (A1) to (E), $E^1$ represents a single bond or a divalent linking group (i.e., a divalent organic residue), $E^2$ represents a single bond or a divalent linking group other than —$CH_2$—. Q represents a group represented by any one of formulae (1) to (3). Examples of the divalent linking group represented by $E^1$ and $E^2$ include —O—, —S—, —OCH($CH_2$-Q)$CH_2$—, —$CO_2$—$CH_2$—, —OCH$_2$C($CH_2$-Q)$_2$CH$_2$—, —O—CONHCH$_2$CH$_2$—, —OC(=O)—, —CONHCH$_2$CH$_2$—, —$CH_2$C($CH_2$-Q)$_2$CH$_2$—, —$CH_2$—, —NHCONHCH$_2$CH$_2$—, —NHCH($CH_2$-Q)$CH_2$—, —NCH($CH_2$-Q)$CH_2$—, —NHCH$_2$C($CH_2$-Q)$_2$CH$_2$—, —NH—CH($CH_2$-Q)$CH_2$—, —C(=O)—, —$CO_2$—$CH_2$CH$_2$—, and —$CO_2$—$CH_2$CH$_2$CH$_2$—. Herein, Q represents a group represented by any one of formulae (1) to (3).

A diol compound in which at least one of the two hydroxyl groups is secondary alcohol is preferable. Preferred diol compound is represented by formula (F), in which one hydroxyl group is a secondary alcohol and the other hydroxyl group is a primary alcohol.

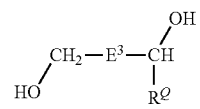

Formula (F)

In formulae (A1) to (E), $R^Q$ represents a substituent group and $E^3$ represents a single bond or a divalent linking group. Herein, at least one of $R^Q$ and $E^3$ is a group represented by any one of formulae (1) to (3) or a group having such group.

Of the compounds represented by formula (F), a compound in which $R^Q$ contains a group represented by any one of formulae (1) to (3) is preferable. More preferably, it is a compound in which $E^3$ is a single bond and $R^Q$ is expressed as -A-Q. Herein, A represents a divalent linking group and Q includes a group represented by any one of formulae (1) to (3).

Of the compounds represented by formula (F), more preferred is a compound represented by formula (G).

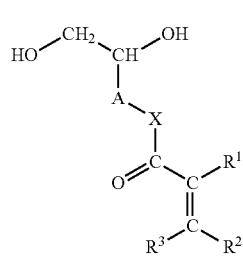

Formula (G)

In formula (G), $R^1$ to $R^3$ each independently represent a hydrogen atom or a substituent, A represents a divalent organic residue, X represents an oxygen atom, a sulfur atom, or —N($R^{12}$)—, and $R^{12}$ represents a hydrogen atom or a substituent. Herein, $R^1$ to $R^3$ and X in formula (G) are the same as $R^1$ to $R^3$ and X in formula (1), and preferred embodiments thereof are also the same.

It is considered that by using a polyurethane resin derived from such a diol compound represented by formula (G), an effect of preventing excessive molecular motion of the main polymer chain is obtained by virtue of the secondary alcohol having a larger steric hindrance, and the film strength of the layer can be elevated.

Further, in formulae (A1) to (E), (F), and (G), $E^1$, $E^2$, and A each do not have the carbonyloxy-aliphatic group A, which is represented by —C(O)—O-(a divalent aliphatic group)- (*), in which a hydroxyl group or an acyloxy group is substituted at the β position or γ position, and the structure of the group represented by any one of formulae (1) to (3) is present at the (*) side, i.e. the aliphatic moiety side but not the carbonyloxy moiety side, of the group —C(O)—O-(a divalent aliphatic group)-. The same as in the above is applied to the case where $R^Q$ or $E^3$ has a group represented by any one of formulae (1) to (3) or a group having such group.

Specific examples of the compound represented by any one of formulae (A1) to (E) include the compounds described in paragraph [0057] to [0060] of JP-A-2005-250438.

Examples of the compound represented by formula (F) or (G) include the followings, but the present invention is not limited to those.

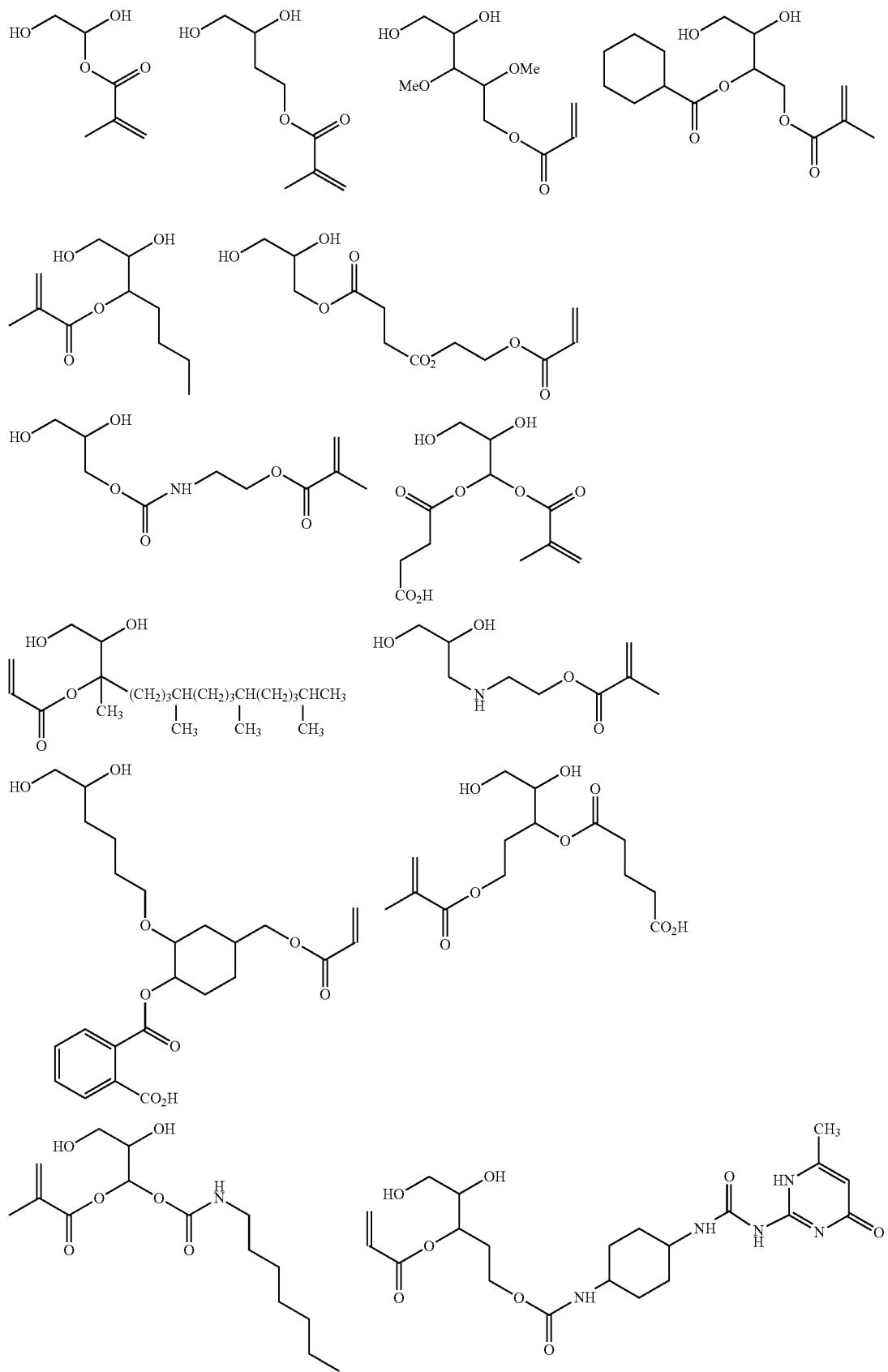

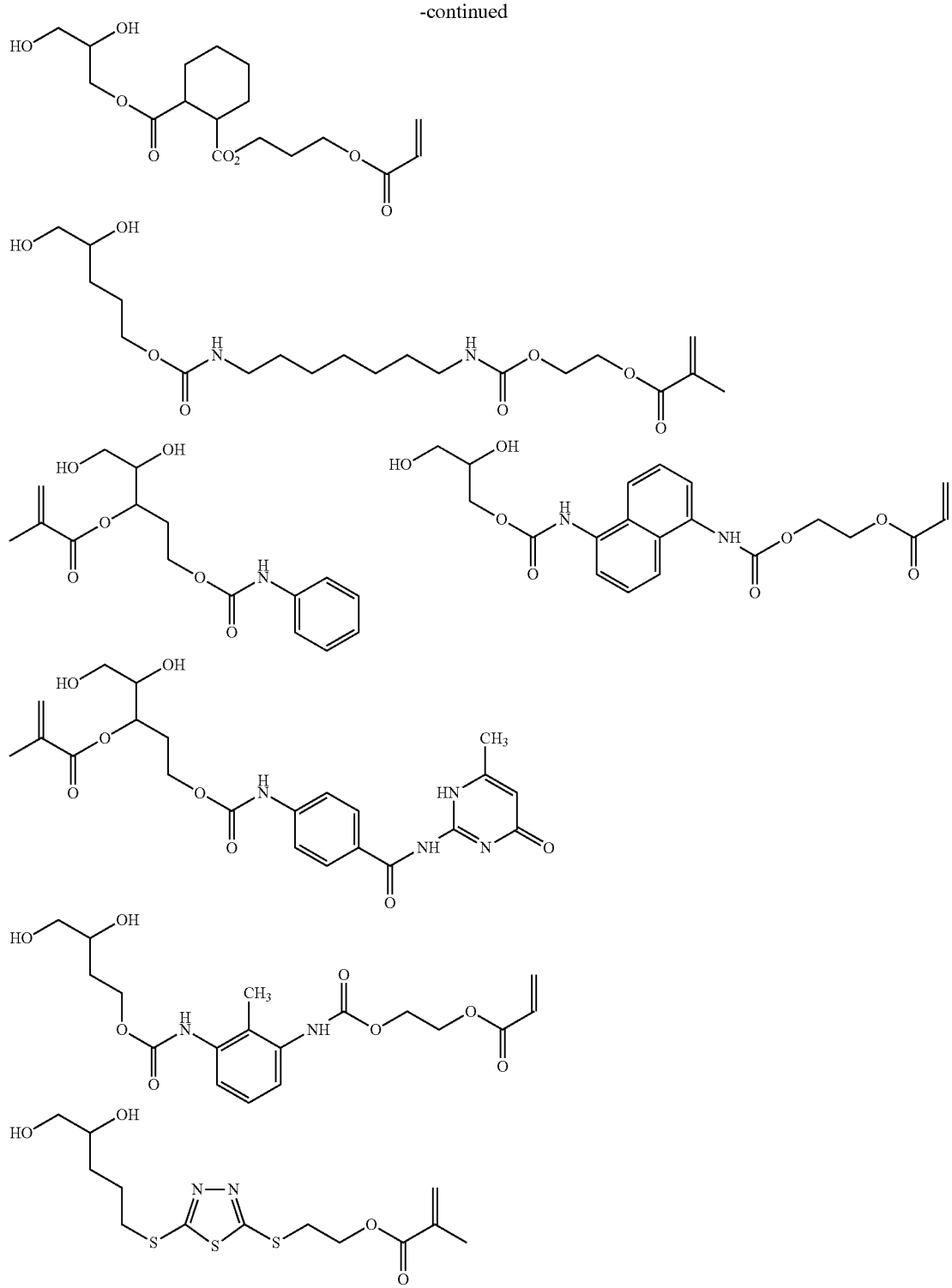

-continued

In the carboxyl group-containing photosensitive polyurethane resin for use in the present invention, a diol compound other than the above-described diol compound having an unsaturated group may be copolymerized from the standpoint of, for example, elevating compatibility with other components in the polymerizable composition and enhancing the storage stability.

The diol compound other than the diol compound having an unsaturated group in the side chain is not specifically limited, and it may be suitably selected in accordance with the intended use. Examples thereof include polyether diol compounds, polyester diol compounds, and polycarbonate diol compounds.

Weight average molecular weight of the diol compound is preferably 300 or more, more preferably 400 or more, still more preferably 700 or more, and most preferably 1,000 or more. Upper limit of the weight average molecular weight is preferably 2,000 or less, more preferably 1,800 or less, and most preferably 1,500 or less. When the weight average molecular weight is less than 300, sufficient bending resistance may be not obtained. On the other hand, when it is more than 2,000, glass transition temperature (Tg) of the polyurethane resin obtained is decreased too much, and thus the insulation reliability may be impaired.

The diol compound is preferably a compound represented by any one of formulae (I-1) to (I-7). In addition, the structure represented by formula (I-7) has an ethylenically unsaturated group in the main chain thereof.

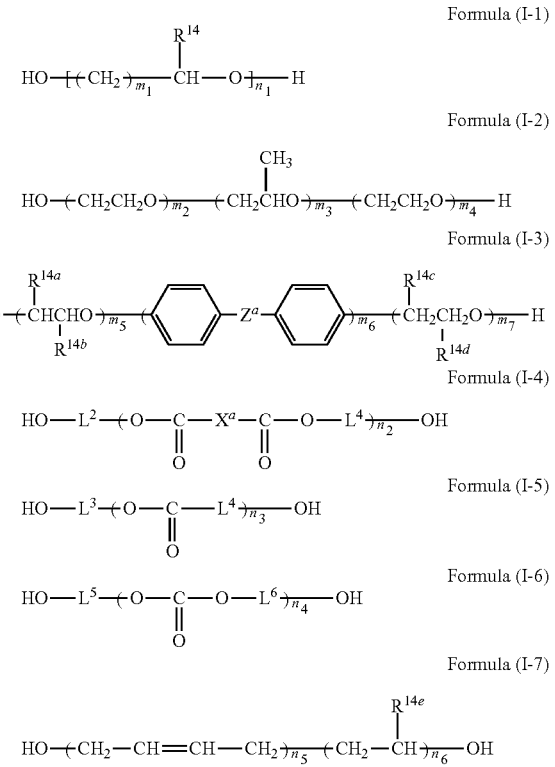

In formulae (I-1) to (I-7), $L^2$, $X^a$, $L^3$, $L^4$, $L^5$, and $L^6$ each independently represent a divalent aliphatic group or a divalent aromatic group. $L^2$, $L^3$, $L^4$, $L^5$, and $L^6$ are preferably an alkylene group having 2 to 20 carbon atoms or an arylene group having 6 to 15 carbon atoms, and more preferably an alkylene group having 2 to 10 carbon atoms or an arylene group having 6 to 10 carbon atoms, $X^a$ is preferably an alkylene group having 1 to 20 carbon atoms or an arylene group having 6 to 15 carbon atoms, and more preferably an alkylene group having 1 to 10 carbon atoms or an arylene group having 6 to 10 carbon atoms. In addition, in $L^2$, $X^a$, $L^3$, $L^4$, $L^5$ and $L^6$, other functional group which does not react with an isocyanate group, for example, an ether group, a carbonyl group, an ester group, a cyano group, an olefin group, an urethane group, an amide group, an ureido group, or a halogen atom may be included. $R^{14}$ and $R^{14a}$ to $R^{14d}$ each independently represent a hydrogen atom, an alkyl group, an aryl group, an aralkyl group, a cyano group, or a halogen atom. A hydrogen atom, an alkyl group having 1 to 10 carbon atoms, an aryl group having 6 to 15 carbon atoms, an aralkyl group having 7 to 15 carbon atoms, a cyano group, or a halogen atom is preferable. A hydrogen atom, an alkyl group having 1 to 6 carbon atoms, or an aryl group having 6 to 10 carbon atoms is more preferable. A hydrogen atom or a methyl group is particularly preferable. As for $R^{14a}$ to $R^{14d}$, $R^{14a}$ and $R^{14b}$ each are preferably a hydrogen atom, or one is a hydrogen atom and the other is a methyl group. $R^{14c}$ and $R^{14d}$ each are preferably a hydrogen atom, or one is a hydrogen atom and the other is a methyl group. In $R^{14}$ and $R^{14a}$ to $R^{14d}$, other functional group which does not react with an isocyanate group, for example, an alkoxy group, a carbonyl group, an olefin group, an ester group, or a halogen atom may be also included. $R^{14e}$ represents an aryl group or a cyano group, and preferably an aryl group having 6 to 10 carbon atoms or a cyano group. $Z^a$ represents —O—, —S— or —C($R^{14f}$)($R^{14g}$)—. Herein, $R^{14f}$ and $R^{14g}$ each independently represent a hydrogen atom or an alkyl group. $m_1$ represents an integer from 1 to 4. $m_2$ to $m_7$ each independently represent an integer of 2 or more, and preferably an integer from 2 to 100. $n_1$ to $n_5$ each independently represent an integer of 2 or more, and preferably an integer from 2 to 100. $n_6$ represents 0 or an integer of 2 or more, and preferably 0 or an integer from 2 to 100.

Of the compounds represented by any one of formulae (I-1) to (I-7), the compound represented by any one of formulae (I-1) to (I-6) is more preferable, and the compound represented by any one of formulae (I-1) to (I-3) is still more preferable.

Examples of the compound represented by formula (I-1), in which $m_1$ is 1 or 2, include diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having a weight-average molecular weight of 1000, polyethylene glycol having a weight-average molecular weight of 1500, polyethylene glycol having a weight-average molecular weight of 2000, polyethylene glycol having a weight-average molecular weight of 3000, polyethylene glycol having a weight-average molecular weight of 7500, polypropylene glycol having a weight-average molecular weight of 400, polypropylene glycol having a weight-average molecular weight of 700, polypropylene glycol having a weight-average molecular weight of 1000, polypropylene glycol having a weight-average molecular weight of 2000, polypropylene glycol having a weight-average molecular weight of 3000, polypropylene glycol having a weight-average molecular weight of 4000, and the like.

Examples of the compound represented by formula (I-1), in which $m_1$ is 3, include PTMG650, PTMG1000, PTMG2000, and PTMG3000 (trade names, all manufactured by Sanyo Chemical Industries, Ltd.), and the like.

Examples of the compound represented by formula (I-2) include Newpol PE-61, Newpol PE-62, Newpol PE-64, Newpol PE-68, Newpol PE-71, Newpol PE-74, Newpol PE-75, Newpol PE-78, Newpol PE-108, Newpol PE-128, and Newpol PE-61 (trade names, all manufactured by Sanyo Chemical Ind., Ltd.), and the like.

Examples of the compound represented by formula (I-3) include Newpol BPE-20, Newpol BPE-20F, Newpol BPE-20NK, Newpol BPE-20T, Newpol BPE-20G, Newpol BPE-40, Newpol BPE-60, Newpol BPE-100, Newpol BPE-180, Newpol BPE-2P, Newpol BPE-23P, Newpol BPE-3P, and Newpol BPE-5P (trade names, all manufactured by Sanyo Chemical Ind., Ltd.), and the like.

Specific examples of the ethylene oxide-propylene oxide random copolymer having a hydroxyl group at the terminal include Newpol 50HB-100, Newpol 50HB-260, Newpol 50HB-400, Newpol 50HB-660, Newpol 50HB-2000, Newpol 50HB-5100 (trade names, all manufactured by Sanyo Chemical Ind., Ltd.), and the like.

Specific examples of the compounds represented by any one of formulae (I-4) to (I-7) include those described below. Further, in the specific examples, n represents an integer of 2 or more.

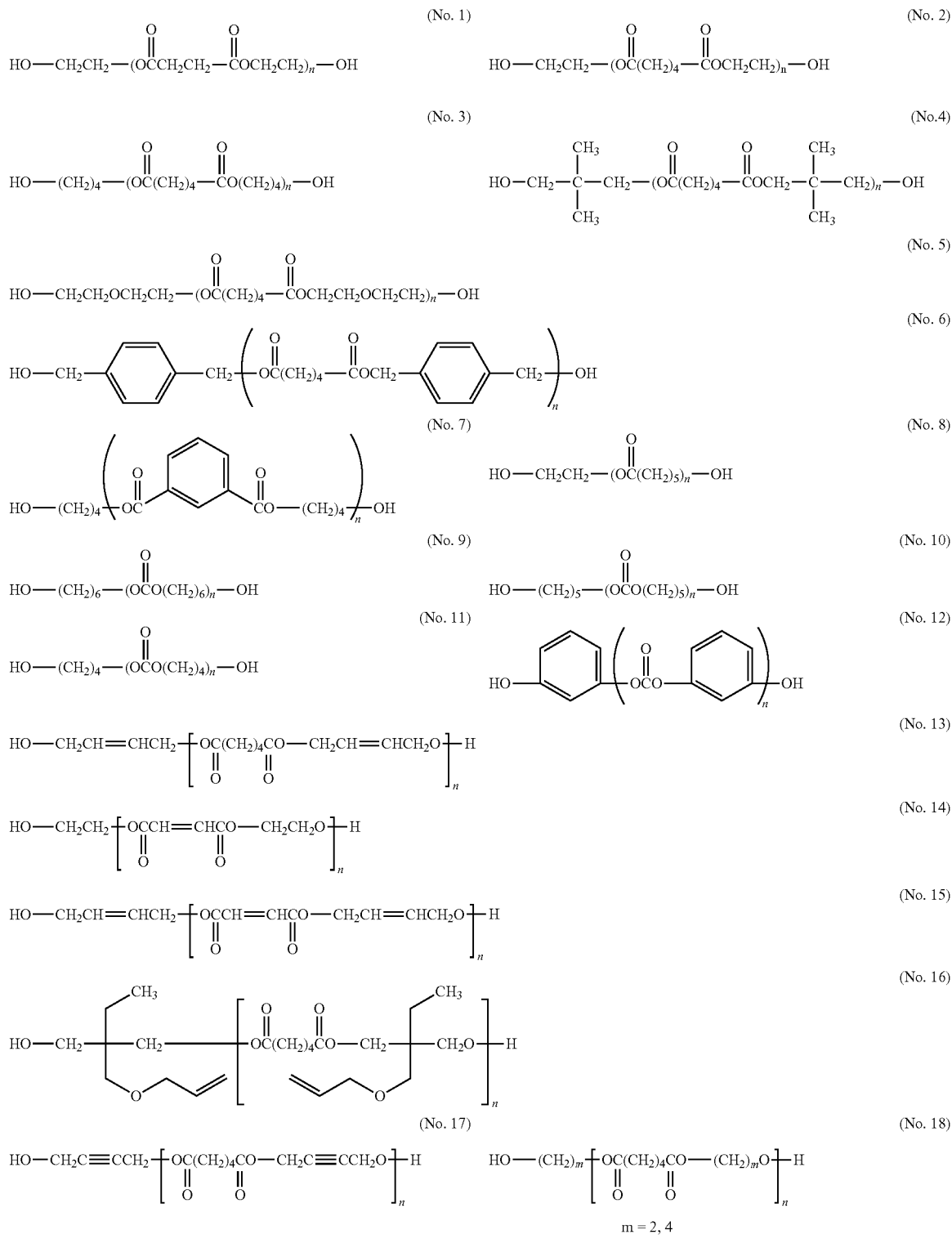

Weight ratio of the diol compound other than the diol compound having an unsaturated group in the side chain contained in the carboxyl group-containing photosensitive polyurethane resin used in the present invention is preferably from 10% to 60%, and more preferably from 20% to 55%. When the weight ratio is less than 10%, it may be difficult to inhibit warp after hardening. On the other hand, when it is more than 60%, sensitivity of the photocuring is decreased too much so that the resolution may be deteriorated.

Further, in addition to these diol compounds, a diol compound having a carboxyl group may also be used in combination for the synthesis of the carboxyl group-containing photosensitive polyurethane resin used in the present invention. Examples of the diol compound having a carboxyl group include compounds represented by any one of formulae (17) to (19).

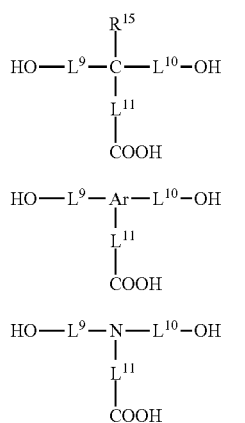

In formulae (17) to (19), $R^{15}$ is not particularly limited and may be suitably selected in accordance with the intended use, as long as it represents a hydrogen atom or an alkyl, aralkyl, aryl, alkoxy or aryloxy group which may have a substituent (examples of the substituent include a cyano group, a nitro group, a halogen atom such as —F, —Cl, —Br, —I, —$CONH_2$, —$COOR^{16}$, —$OR^{16}$, —$NHCONHR^{16}$, —$NHCOOR^{16}$, —$NHCOR^{16}$, —$OCONHR^{16}$ (wherein $R^{16}$ represents an alkyl group having 1 to 10 carbon atoms or an aralkyl group having 7 to 15 carbon atoms). $R^{15}$ is preferably a hydrogen atom, an alkyl group having 1 to 8 carbon atoms, or an aryl group having 6 to 15 carbon atoms.

In formulae (17) to (19), $L^9$, $L^{10}$ and $L^{11}$, which may be the same as or different from each other. $L^9$, $L^{10}$ and $L^{11}$ are not particularly limited and may be suitably selected in accordance with the intended use, as long as they represent a single bond or a divalent aliphatic or aromatic hydrocarbon group which may have a substituent (examples of the substituent include an alkyl group, an aralkyl group, an aryl group, an alkoxy group and a halogen atom). $L^9$, $R^{10}$ and $L^{11}$ each are preferably an alkylene group having 1 to 20 carbon atoms or an arylene group having 6 to 15 carbon atoms, and more preferably an alkylene group having 1 to 8 carbon atoms. If desired, $L^9$ to $L^{11}$ each may contain another functional group which does not react with the isocyanate group, such as a carbonyl group, an ester group, a urethane group, an amide group, a ureido group, and an ether group.

Two or three of $R^{15}$, $L^7$, $L^8$ and $L^9$ may form a ring.

In formula (18), Ar is not particularly limited and may be suitably selected in accordance with the intended use, as long as it represents a trivalent aromatic hydrocarbon group which may have a substituent, and preferably an aromatic group having 6 to 15 carbon atoms.

The carboxyl group-containing diol compound represented by any one of formulae (17) to (19) is not particularly limited and may be suitably selected in accordance with the intended use. Specific examples thereof include 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine, N,N-bis(2-hydroxyethyl)-3-carboxy-propionamide, and the like.

By virtue of the presence of a carboxyl group, properties such as a hydrogen bonding property and alkali solubility can be imparted to the polyurethane resin and this is preferred. More specifically, the polyurethane resin having an ethylenically unsaturated group in the side chain is a resin further having a carboxyl group in the side chain. Still more specifically, a polyurethane resin having 0.05 mmol/g to 3.0 mmol/g, more preferably from 0.5 mmol/g to 3.0 mmol/g, and particularly preferably from 0.75 mmol/g to 3.0 mmol/g of an ethylenically unsaturated group in the side chain, and also having a carboxyl group in the side chain is preferable. the polyurethane resin having an acid value of 20 ma KOH/g to 120 mg KOH/g, more preferably, 30 mg KOH/g to HO mg KOH/g, still more preferably, 35 mg KOH/g to 100 mg KOH/g is preferable.

Herein, equivalent of an ethylenically unsaturated group described above can be obtained by measuring a bromine number, for example. The bromine number can be measured according to JIS K2605, for example. Equivalent of a vinyl group is a typical example of the equivalent of an ethylenically unsaturated group, which is obtained from the gram number of bromine ($Br_2$) added to 100 g of a resin (i.e., g $Br_2$/100 g) to be measured with the bromine number, wherein the gram number of bromine is converted to mole number of bromine ($Br_2$) added per gram of the resin.

The acid value can be measured according to JIS K0070, for example. Further, when the sample is not dissolved, dioxane or tetrahydrofuran is used as a solvent. The acid value is an acid value of a solid content of the resin.

For the synthesis of the carboxyl group-containing photosensitive polyurethane resin used in the present invention, a compound obtained by ring-opening of tetracarboxylic acid dianhydride using a diol compound can be used other than the diol compound described above.

The compound obtained by ring-opening of tetracarboxylic acid dianhydride using a diol compound is not specifically limited and it may be suitably selected in accordance with the intended use. Examples thereof include the compounds described in paragraph [0095] to [0101] of JP-A-2005-250438.

As for the polyurethane resin having an ethylenically unsaturated bond in the side chain, a resin having an alkali developable group in the polymer terminal and the main chain can be also suitably used. By having an alkali developable group in the polymer terminal and the main chain, the developing property is improved more at the time of alkali development, and therefore an excellent pattern formability is obtained. Further, cross-reaction reactivity between the thermo-crosslinking agent and the polyurethane resin having an ethylenically unsaturated bond in the side chain is increased, yielding an increase in strength of a cured product. As a result, when the polyurethane resin having an ethylenically unsaturated bond in the side chain is used for a material for printed board, a material with excellent durability can be provided. Herein, as an alkali developable group, a group having a carboxyl group is particularly preferable from the viewpoint of obtaining a developing property by using dilute alkali.

Examples of a method of introducing an alkali developable group to a polymer terminal include the followings.

—Carboxyl Group at the Terminal of Main Chain—

At the terminal of the main chain of the polyurethane resin, at least one carboxyl group is introduced. Preferably, two to five carboxyl groups are introduced. Particularly preferably, from the viewpoint of micropattern formability, two carboxyl groups are introduced to have excellent developing property.

Further, although there are two terminals of main chain of the polyurethane resin, it is preferable that at least one carboxyl group is present at single terminal. It is also possible to have at least one carboxyl group at both terminals.

It is preferable that the structure represented by formula (A) is present at the terminal of the main chain of polyurethane resin.

-L$^{A1}$-(COOH)$_n$    Formula (A)

In formula (A), L$^{A1}$ represents an organic linking group with a valency of (n+1), wherein n represents an integer of 1 or more and it is preferably from 1 to 5 and particularly preferably 2.

The organic linking group represented by L$^{A1}$ is composed by having at least one atom selected from a carbon atom, a hydrogen atom, an oxygen atom, a nitrogen atom, and a sulfur atom. Specifically, the number of atoms which constitute the main skeleton of the organic linking group represented by L$^{A1}$ is preferably from 1 to 30, more preferably from 1 to 25, still more preferably from 1 to 20, and particularly preferably from 1 to 10.

The term "main skeleton of the organic linking group" means an atom or a group of atoms that are utilized only for linking L$^{A2}$ of formula (A1) below to the terminal COOH, and when there are a plurality of linking routes, it indicates an atom or a group of atoms which constitute a route with the minimum number of atoms utilized.

Method of introducing at least one carboxyl group to the terminal of the main chain of the polyurethane resin is not specifically limited and it may be suitably selected in accordance with the intended use. For example, there is a method of using a carboxylic acid compound having at least one carboxyl group as a material for producing the polyurethane resin.

—Carboxylic Acid Compound—

Examples of the carboxylic acid compound include a monocarboxylic acid compound having one carboxyl group, a dicarboxylic acid compound having two carboxyl groups, a tricarboxylic acid compound having three carboxyl groups, a tetracarboxylic acid compound having four carboxyl groups, and a pentacarboxylic acid compound having five carboxyl groups. Of these, from the viewpoint of micropattern formability, a dicarboxylic acid compound having two carboxyl groups is particularly preferable in that it has excellent developing property.

The carboxylic acid compound is not particularly limited if it has at least one carboxyl group, and it may be suitably selected in accordance with the intended use. However, the compound represented by formula (AI) is suitable.

HO-L$^{A2}$-L$^{A1}$-(COOH)$_n$    Formula (AI)

In formula (AI), L$^{A1}$ and n have the same meanings as defined above for formula (A).

In formula (AI), L$^{A2}$ represents a single bond or an alkylene group which may have a substituent group. As an alkylene group, an alkylene group having 1 to 20 carbon atoms is preferable, and an alkylene group having 2 to 10 carbon atoms is more preferable. Examples of the substituent which may be introduced to an alkylene group include a halogen atom (—F, —Br, —Cl, —I) and an alkyl group which may have a substituent group.

The carboxylic acid compound represented by formula (AI) is not specifically limited and it may be suitably selected in accordance with the intended use. Examples thereof include lactic acid, malic acid, hydroxyl hexanoic acid, citric acid, and a reaction product between a diol compound and acid anhydride. It can be used either alone or in combination of two or more. Of these, malic acid is particularly preferable.

Examples of the reaction product between a diol compound and acid anhydride include a compound represented by the following chemical structure.

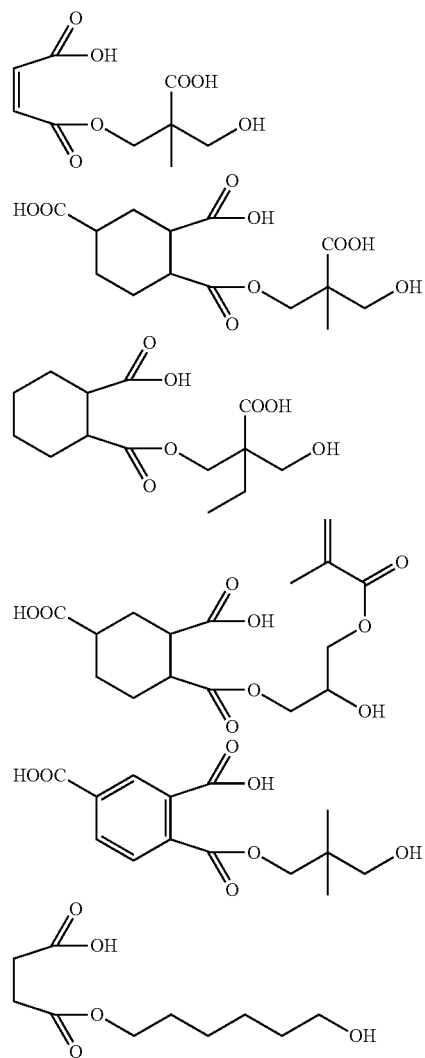

The carboxyl group-containing photosensitive polyurethane used in the present invention is synthesized by adding the above-described diisocyanate compounds and diol compounds and a known catalyst having an activity according to the reactivity of respective compounds in an aprotic solvent and heating the solution. The molar ratio (M$_a$:M$_b$) between diisocyanate compounds and diol compounds used for the synthesis is not particularly limited and properly determined depending on purpose, and preferably from 1:1 to 1.2:1. The reaction product may be treated with alcohols or amines, whereby a polyurethane resin having desired physical properties such as molecular weight and viscosity and having no remaining isocyanate groups can be finally synthesized.

Weight average molecular weight of the carboxyl group-containing photosensitive polyurethane resin used in the present invention is not particularly limited and it may be suitably selected in accordance with the intended use. However, it is preferably from 2,000 to 60,000, more preferably from 2,000 to 50,000, and particularly preferably from 2,000 to 30,000. When the photosensitive composition of the present invention is used for a solder resist, in particular, a dispersion property of an inorganic filler is excellent, crack resistance and heat resistance are excellent, and a developing property of a non-image part by an alkali developer is excellent.

Herein, the weight average molecular weight can be measured with, for example, high speed GPC apparatus (trade name: HLC-802A manufactured by Toyo Soda Co., Ltd.) by using 0.5% by mass THF solution as a sample solution and single TSKgel HZM-M column, injecting 200 µL of a test sample, eluting with the THF solution, and detecting at 25° C. by using refractometer or UV detector (detection wavelength: 254 nm). Further, from the molecular weight distribution curve calibrated using the standard polystyrene, the weight average molecular weight is obtained.

Further, as for the carboxyl group-containing photosensitive polyurethane used in the present invention, those having an unsaturated group at the polymer terminal and in the main chain are also preferably used. By having an unsaturated group at the polymer terminal and in the main chain, the crosslinking reactivity between the photosenstive composition and polyurethane resin having an ethylenically unsaturated bond in the side chain or between the polyurethane resins having an ethylenically unsaturated bond group in the side chain is increased to enhance the strength of the photocured product. Here, the unsaturated group preferably contains a carbon-carbon double bond since the crosslinking reaction can readily occur.

The method of introducing an unsaturated group into the polymer terminal may be the following method. That is, the unsaturated group may be introduced by using an alcohol, an unsaturated group, or the like, having an unsaturated group at the time when the isocyanate group remaining at the polymer terminal in the synthesis of the polyurethane resin having an ethylenically unsaturated bond in the side chain is treated with the alcohol, the amine, or the like. Specific examples of the compound include the same compounds as exemplified above for the monofunctional alcohol or monofunctional amine compound having an unsaturated group.

Further, the unsaturated group is more preferably introduced into the polymer side chain rather than into the polymer terminal, because the amount of the unsaturated group introduced can be easily controlled and can be increased and also, the crosslinking reaction efficiency is enhanced.

In view of formability of a crosslinked and cured film, the ethylenically unsaturated bond group introduced is preferably a methacryloyl group, an acryloyl group or a styryl group, more preferably a methacryloyl group, or an acryloyl group. Also, from the standpoint of satisfying both the formability of a crosslinked and cured film and the raw-storage stability, the ethylenically unsaturated bond group is still more preferably a methacryloyl group.

Introduced amount of the methacryloyl group is not particularly limited and may be suitably selected in accordance with the intended use. However, in terms of an equivalent of an ethylenically unsaturated group (i.e., equivalent of a vinyl group), it is preferably from 0.05 mmol/g to 3.0 mmol/g, more preferably from 0.5 mmol/g to 3.0 mmol/g, and particularly preferably from 0.75 mmol/g to 3.0 mmol/g.

The method of introducing an unsaturated group into the main chain may be a method of using a diol compound having an unsaturated group in the main chain direction for the synthesis of the polyurethane resin. The diol compound having an unsaturated group in the main chain direction is not particularly limited and properly determined depending on purpose, and specific examples thereof include cis-2-butene-1,4-diol, trans-2-butene-1,4-diol, and polybutadiene diol.

Specific examples of the carboxyl group-containing photosensitive polyurethane resin used in the present invention include the P-1 to P-31 polymer that are described in paragraph [0293] to [0310] of JP-A-2005-250438, for example. Of these, the P-27 and P-28 polymer that are described in paragraph [0308] and [0309] are preferable.

In combination with the carboxyl group-containing photosensitive polyurethane resin used in the present invention, an alkali-soluble polymer including a polyurethane resin differing in structure from the carboxyl group-containing photosensitive polyurethane resin used in the present invention may also be used. For example, a polyurethane resin having an aromatic group in the main chain and/or side chain can be concurrently used. However, the polyurethane resin concurrently used also does not contain a phosphorus atom.

However, when a novolac-type acid-modified epoxy resin containing an ethylenically unsaturated group with biphenyl skeleton is concurrently used, in the solid content of the resins, the carboxyl group-containing photosensitive polyurethane resin used in the present invention is preferably 50% by mass or more, more preferably 70% by mass or more, still more preferably 90% by mass or more, and most preferably 100% by mass.

Content of the carboxyl group-containing photosensitive polyurethane resin used in the present invention in the photosensitive composition is not particularly limited and may be suitably selected in accordance with the intended use. However, it is preferably from 5% by mass to 80% by mass, more preferably from 20% by mass to 75% by mass, and particularly preferably from 30% by mass to 70% by mass.

When the content is less than 5% by mass, crack resistance may not be maintained at sufficient level. On the other hand, when it is more than 80% by mass, heat resistance may be deteriorated. However, when the content is within the particularly preferable range described above, it is advantageous from the viewpoint of having both good crack resistance and good heat resistance.

<Phosphorus-Containing Flame Retardant>

The phosphorus-containing flame retardant is not particularly limited and may be suitably selected in accordance with the intended use. Examples thereof include a condensed phosphoric acid compound, polyphosphoric acid melamine salt, a phosphazene compound, and a metal phosphate. It can be used either singly or in combination of two or more.

Examples of the condensed phosphoric acid compound include resorcinol bis-diphenylphosphate, resorcinol bis-dixyleneylphosphate, and bisphenol A bis-diphenylphosphate. A commercially available product can be also used, and examples thereof include CR-733S, CR-741, CR-747, PX-200 (trade names, all manufactured by Daihachi Chemical Industry Co., Ltd.), FP-600, FP-700 (trade names, all manufactured by Adeka Corporation), REOFOS RDP, and REOFOS BAPP (trade names, all manufactured by Ajinomoto Fine-Techno Co., Inc.).

Examples of the polyphosphoric acid melamine salt include a compound represented by the following formula wherein n represents an integer of 1 or more. A commercially available product can be also used, and examples thereof include AP750, AP760, OP1312 (trade names, all manufactured by, Clariant (Japan) K.K.), FP-2100J, FP-2200 (trade names, all manufactured by, Adeka Corporation), HISHI-GARD 6ME (trade name, manufactured by Nippon Chemical Industrial Co., Ltd.), and FCP-770 (trade name, manufactured by Suzuhiro Chemical Co., Ltd.).

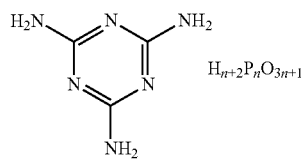

Examples of the phosphazene compound include a compound represented by the following formula wherein R represents a hydrogen atom or an alkyl group having 1 to 8 carbon atoms. A commercially available product can be also used, and examples thereof include SPS-100 (trade name, manufactured by Otsuka Chemical Co., Ltd.).

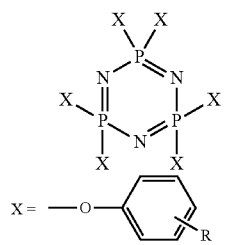

Examples of the metal phosphate include those described by the following formula wherein $A^P$ and $B^P$ each independently represent an alkyl group or an aryl group, M represents at least one selected from Mg, Ca, Al, Sb, Sn, Ge, Ti, Zn, Fe, Zr, Ce, Bi, Sr, Mn, Ni, and Na, and m represents an integer from 1 to 4. Herein, M is preferably Al. In addition, A and B are preferably an alkyl group having 1 to 6 carbon atoms. A methyl group or an ethyl group is more preferable. As a metal phosphate, a commercially available product may be used. Examples of the commercially available product include OP-935 (trade name, manufactured by Clariant (Japan) K.K.).

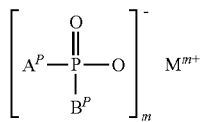

Content of the phosphorus-containing flame retardant in the solid contents of the photosensitive composition is preferably from 10% by mass to 35% by mass, and more preferably from 15% by mass to 30% by mass. When the content is less than 10% by mass, flame retardancy may not be maintained at sufficient level. On the other hand, when it is more than 35% by mass, the resolution and bending resistance may be deteriorated, and also insulation reliability may be deteriorated.

<Polymerizable Compound>

The polymerizable compound used in the present invention does not contain a phosphorus atom. In other words, it preferably consists of an atom selected from a carbon atom, a hydrogen atom, an oxygen atom, a nitrogen atom, and a sulfur atom. In case of a polymerizable compound containing a phosphorus atom, it can react with a resin matrix component to cause an increase in degradation temperature of a phosphorus atom, yielding insufficient flame retardancy, and as a result, the effect of the present invention is not fully obtained.

The polymerizable compound used in the present invention is not particularly limited as long as it does not contain a phosphorus atom, and it may be suitably selected in accordance with the intended use. Preferred examples thereof include a compound having at least one ethylenically unsaturated bond.

However, the polymerizable compound is different from the carboxyl group-containing photosensitive polyurethane resin used in the present invention, and it is a low molecular weight compound having molecular weight of 1,000 or less, i.e., not a polymer.

Examples of the ethylenically unsaturated bond include a vinyl group, for example, of a (meth)acryloyl group, a (meth)acrylamide group, a styryl group, a vinyl ester, and a vinyl ether; and an allyl group, for example, of an allyl ether and an allyl ester.

The compound having at least one ethylenically unsaturated bond is not particularly limited and it may be suitably selected in accordance with the intended use. Examples thereof include at least one selected from monomers having an (meth)acryl group.

The monomer having a (meth)acrylic group is not particularly limited and may be suitably selected in accordance with the intended use. Examples thereof include monofunctional acrylates and monofunctional methacrylates such as polyethylene glycol mono(meth)acrylate, polypropylene glycol mono(meth)acrylate, and phenoxyethyl(meth)acrylate, etc.; compounds prepared by addition-reacting ethylene oxide or propylene oxide with a polyfunctional alcohol followed by (meth)acrylating the addition reaction product such as polyethylene glycol di(meth)acrylate, polypropylene glycol di(meth)acrylate, trimethylolethane triacrylate, trimethylol propane triacrylate, trimethylol propane diacrylate, neopentylglycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth)acrylate, trimethylol propane tri(acryloyloxypropyl)ether, tri(acryloyloxyethyl) isocyanurate, tri(acryloyloxyethyl)cyanurate, glycerine tri(meth)acrylate, trimethylol propane, glycerine, and bisphenol, etc.; urethane acrylates described in JP-B-48-41708, JP-B-50-6034 and JP-A-51-37193; polyester acrylates described in JP-A-48-64183, JP-B-49-43191 and JP-B-52-30490, etc.; and polyfunctional acrylates and methacrylates such as epoxy acrylates which are reaction products between an epoxy resin and (meth)acrylic acid, etc. These may be used alone or in combination with two or more. Of these, trimethylol propane tri(meth)acrylate, pentaerythritol tetra(meth)acrylate, dipentaerythritol hexa(meth)acrylate, and dipentaerythritol penta(meth)acrylate are particularly preferable.

The content of the polymerizable compound in solid content of the photosensitive composition is preferably 5% by mass to 50% by mass, and more preferably 10% by mass to 40% by mass. When the content is 5% by mass or more, the developing property and the sensitivity to exposure are improved. When it is 50% by mass or less, too much increase in adhesiveness of a photosensitive layer may be prevented.

<Photopolymerization Initiator>

The photopolymerization initiator is not particularly limited and may be suitably selected from among those known in the art as long as the photopolymerization initiator has an ability to initiate polymerization of the polymerizable compound. Examples of the photopolymerization initiator include halogenated hydrocarbon derivatives (such as halogenated hydrocarbon derivative having a triazine skeleton or an oxadiazole skeleton); phosphine oxides, hexaarylbiimidazole, oxime derivatives, organic peroxides, thio compounds, ketone compounds, aromatic onium salts, and ketoxime ethers.

The halogenated hydrocarbon compound is not particularly limited and may be suitably selected depending on the purpose. Examples of the halogenated hydrocarbon compound having a triazine skeleton include the compounds described in Bulletin of the Chemical Society of Japan, 42, 2924 (1969) reported by Wakabayashi et al.; compounds described in Great Britain Patent No. 1388492; compounds described in JP-A-53-133428; compounds described in Germany Patent No. 3337024; compounds described in the Journal of Organic Chemistry, 29,1527 (1964) reported by F. C. Schaefer et al.; compounds described in JP-A-62-58241; and compounds described in JP-A-5-281728; compounds described in JP-A-5-34920. Examples of the halogenated hydrocarbon compound having an oxadiazole skeleton include compounds described in U.S. Pat. No. 4,212,976.

The oxime derivatives are not particularly limited and they may be suitably selected in accordance with the intended use. Examples thereof include a compound described in paragraph [0085] of JP-A-2007-2030.

The ketone compounds are not particularly limited and they may be suitably selected in accordance with the intended use. Examples thereof include a compound described in paragraph [0087] of JP-A-2007-2030.

The photopolymerization initiator other than those described above is not particularly limited and it may be suitably selected in accordance with the intended use. Examples thereof include a compound described in paragraph [0086] of JP-A-2007-2030.

To control the exposure sensitivity and sensing wavelength in exposure of the photosensitive layer, a photosensitizer may be added in addition to the photopolymerization initiator.

The photosensitizer may be suitably selected depending on the type of visible light, ultraviolet ray, and visible laser as a light irradiation unit, which will be described in the below.

The photosensitizer can be excited by active energy ray, to generate a utility group, such as a radical, an acidic group, and the like, through interaction (e.g. by transferring energy or electrons) with other substances (e.g. radical generating agents and acid generating agents).

The photosensitizer is not particularly limited and it may be suitably selected in accordance with the intended use. Examples thereof include a compound described in paragraph [0089] of JP-A-2007-2030.

Combination of the photopolymerization initiator and the photosensitizer is not particularly limited and it may be suitably selected in accordance with the intended use. Examples thereof include a combination of electron transferring initiation system described in JP-A 2001-305734 [(1) an electron donating initiator and a sensitizing pigment, (2) an electron accepting initiator and a sensitizing pigment, and (3) an electron donating initiator, a sensitizing pigment and an electron accepting initiator (a ternary initiation system)].

The content of the photosensitizer is not particularly limited and they may be suitably selected in accordance with the intended use. The content of the photosensitizer is preferably 0.05% by mass to 30% by mass relative to the total components of the photosensitive resin composition, more preferably 0.1% by mass to 20% by mass, and still more preferably 0.2% by mass to 10% by mass. When the content of the photosensitizer is less than 0.05% by mass, the photosensitivity to active energy ray may decrease, and the exposing process may take time, resulting in decreased productivity. When the content of the photosensitizer is more than 30% by mass, the photosensitizer may be precipitated from the photosensitive layer.

Each of the photopolymerization initiators may be used alone or in combination with two or more.

Particularly preferred examples of the photopolymerization initiator include the phosphine oxides, the α-aminoalkylkeones, composite initiators in which halogenated hydrocarbon compounds having triazine skeletons are combined with amine compounds as photosensitizers, hexaarylbiimidazole compounds; or titanocenes, which can cope with laser beam with wavelength 405 nm in the exposure described below.

The content of the photopolymerization initiator in the photosensitive composition is preferably 0.5% by mass to 20% by mass, more preferably 0.5% by mass to 15% by mass, and particularly preferably 1% by mass to 10% by mass.

When the content is less than 0.5% by mass, the exposed region tends to get eluted during development. When it is more than 20% by mass, heat resistance may be deteriorated. Meanwhile, when the content is within the particularly preferable range described above, it is advantageous in that a favorable pattern can be formed and favorable heat resistance can be obtained.

<Thermo-Crosslinking Agent>

The thermo-crosslinking agent is not particularly limited and may be suitably selected in accordance with the intended use. In order to enhance the film strength of the hardened photosensitive layer which is formed by using the photosensitive film, for example, it is possible to use an epoxy group-containing compound, such as an epoxy compound having at least two oxirane groups in the molecule, or an oxetane compound having at least two oxetanyl groups in the molecule, as long as which gives no adverse affection to the developing property of the photosensitive layer. Example include an epoxy compound having an oxirane group, as described in JP-A-2007-47729, an epoxy compound having an alkyl group at β position, an oxetane compound having an oxetanyl group, a polyisocyanate compound, a compound obtained by reaction of an blocking agent with an isocyanate group of a polyisocyanate or its derivative.

Further, for the thermo-crosslinking agent, melamine derivatives may be used. Examples of the melamine derivatives include methylolmelamine, and alkylated methylol melamine (a compound in which a methylol group is etherified with methyl, ethyl, or butyl). These may be used alone or in combination. Of these, alkylated methylol melamine is preferable, and hexa-methylated methylol melamine is particularly preferable in that excellent storage stability of the photosensitive layer can be assured, and it is useful in enhancing the surface hardness of the photosensitive layer or the film strength of the hardened film itself.

The content of the thermo-crosslinking agent in solid content of the photosensitive composition is preferably 1% by mass to 50% by mass, and more preferably 3% by mass to 30% by mass. When the content is 1% by mass or more, film strength of a cured film is improved. When it is 50% by mass or less, a developing property and exposure sensitivity are improved.

Examples of the epoxy compound include an epoxy compound having at least two oxirane groups within one molecule and an epoxy compound having at least two epoxy groups within one molecule, in which an alkyl group is present at β position.

Examples of the epoxy compound having at least two oxirane groups within one molecule include bixylenol epoxy resins or biphenol epoxy resins (product name: "YX4000", manufactured by Japan Epoxy Resin K.K.) or mixtures thereof; heterocyclic epoxy resins having an isocyanurate skeleton or the like (product name: "TEPIC", manufactured by NISSAN CHEMICAL INDUSTRIES, LTD., "ARALDITE PT810", manufactured by Chiba Specialty Chemicals K.K., and the like); bisphenol A epoxy resins, novolac epoxy resins, bisphenol F epoxy resins, hydrogenerated bisphenol A epoxy resins, bisphenol S epoxy resins, phenol novolac epoxy resins, cresol novolac epoxy resins, haloganated epoxy resins (such as low brominated epoxy resins, high haloganated epoxy resins, brominated phenol novolac epoxy resins), allyl group containing bisphenol A epoxy resins, trisphenol methan epoxy resins, diphenyldimethanol epoxy resins, phenol biphenylene epoxy resins, dicyclopentadiene epoxy resins ("HP-7200" and "HP-7200H" manufactured by Dainippon Ink and Chemicals, Inc., etc.); glycidylamine epoxy resins (diaminodiphenylmethane epoxy resins, glycidylaniline, triglycidylaminophenol), glycidylester epoxy resins (phthalic acid diglycidyl ester, adipi acid diglycidyl ester, hexahydrophthalic acid glycidyl ester, dimer acid glycidyl ester etc.); hydantoin epoxy resins, alicyclic epoxy resins (such as 3,4-epoxy cyclohexenylmethyl-3',4'-epoxy cyclohexenyl carboxyl ate, bis(3,4-epoxycyclohexylmethyl)adipate, dicyclopentadiene diepoxide, GT-300, GT-400, ZEHPE3150, manufactured by Daniel Chemical Industries, Ltd.), imide cycloaliphatic epoxy resins, trihydroxyphenylmethane epoxy resins, bisphenol A novolac epoxy resins, tetraphenylolethane epoxy resins, glycidyl phthalate resins, tetraglycidylxylenoylethan resins, naphthalene group-containing epoxy resins (naphthol aralkyl epoxy resins, naphthol novolac epoxy resins, tetrafunctional naphthalene epoxy resins, those commercially available include ESN-190, ESN-360 by Nippon Steel Chemical, HP-4032, EXA-4750, EXA-4700 manufactured by Dainippon Ink and Chemicals, Inc., etc.); reactants obtained from a reaction between epichlorohydrin and a polyphenol compound which is obtained by addition reaction between a phenol compound and a diolefin compound such as divinylbenzene or dicyclopentadiene; a ring-opening polymerization product of 4-vinylcyclohexene-1-oxide epoxidized with peracetic acid or the like; epoxy resins having linear phosphorus containing structure; epoxy resins having cyclic phosphorus containing structure; α-methylstilbene liquid crystal epoxy resins, dibenzoyloxybenzene liquid crystal epoxy resins; azophenyl liquid crystal epoxy resins; azomethine phenyl liquid crystal epoxy resins; binaphthyl liquid crystal epoxy resins; azine epoxy resins; glycidylmethacrylate copolymer epoxy resins ("CP-50S" and "CP-50M" manufactured by NOF Corporation, etc.), and copolymerized epoxy resins between cyclohexyl maleimide and glycidyl methacrylate, bis(glycidyloxyphenyl)fluorine epoxy resins, and bis(glycidyloxyphenyl)adamantine epoxy resins. However, the thermo-crosslinking agent is not limited to those described above. These epoxy resins may be used alone or in combination.

Further, other than the epoxy compound containing at least two oxirane groups per molecule, use may be made of an epoxy compound containing two epoxy groups per molecule, having an alkyl group at the α- or β-position. Compounds containing an epoxy group the α- or β-position of which is substituted by an alkyl group (more specifically a β-alkyl-substituted glycidyl group or the like) are particularly preferred.

The epoxy compound containing at least an epoxy group of which the α- or β-position has an alkyl group may be such that each of the two or more epoxy groups contained in one molecule is a β-alkyl-substituted glycidyl group, or alternatively at least one epoxy group is a β-alkyl-substituted glycidyl group.

Examples of the oxetane compound include an oxetane compound having at least two oxetanyl groups per molecule.

Examples of the oxetane compounds include polyfunctional oxetanes such as bis[(3-methyl-3-oxetanylmethoxy) methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methyl acrylate, (3-methyl-3-oxetanyl)methyl methacrylate, (3-ethyl-3-oxetanyl)methyl methacrylate, oligomers thereof, or copolymers thereof; ether compounds prepared between a compound having an oxetane group and a resin having a hydroxyl group such as novolac resin, poly(p-hydroxystyrene), cardo bisphenols, calix-arenes, calix-resorcin arenas, silsesquioxane; and copolymers between an unsaturated monomer having an oxetane ring and an alkyl(meth)acrylate.

For the above-noted polyisocyanate compound, it is possible to use polyisocyanate compounds described in JP-A-5-9407, and the polyisocyanate compounds may be derived from an aliphatic compound, an alicyclic compound or an aromatic group-substituted aliphatic compound each of which contains at least two isocyanate groups. Specific examples of such polyisocyanate compounds include bifunctional isocyanates such as mixtures of 1,3-phenylene diisocyanate and 1,4-phenylene diisocyanate, 2,4-toluene diisocyanate, 2,6-toluene diisocyanate, 1,3-xylylene diisocyanate, 1,4-xylylene diisocyanate, bis(4-isocyanate-phenyl)methane, bis(4-isocyanatecyclohexyl)methane, isophorone diisocyanate, hexamethylene diisocyanate, trimethylhexamethylene diisocyanate; polyfunctional alcohols compounded from the bifunctional isocyanate, and trimethylolpropane, pentaerythritol or glycerine; alkylene oxide adducts of the above-noted polyfunctional alcohol, and adducts with the above-noted bifunctional isocyanate; and cyclic trimers from hexamethylene diisocyanate, hexamethylene-1,6-diisocyanate, or derivatives thereof.

Examples of the isocyanate group blocking agent for a compound that can be prepared by reacting a blocking agent to the polyisocyanate or isocyanate group of the derivatives thereof include alcohols such as isopropanol, and tert-butanol; lactams such as ε-caprolactam; phenols such as phenol, cresol, p-tert-butylphenol, p-sec-butylphenol, p-sec-aminophenol, p-octylphenol, and p-nonylphenol; heterocyclic hydroxyl compounds such as 3-hydroxypyridine, and 8-hydroxyquinoline; active methylene compounds such as dialkyl malonate, methyl ethyl ketoxime, acetylacetone, alkyl acetoacetate oxime, acetooxime, and cyclohexanon oxime. Besides, the compounds having at least one polymerizable double bond and having at least one block isocyanate group in one molecule, which are described in JP-A-6-295060, may be used.

Examples of the melamine derivatives include methylolmelamine, and alkylated methylol melamine (a compound in which a methylol group is etherified with methyl, ethyl, or butyl). These may be used alone or in combination. Of these, alkylated methylol melamine is preferable, and hexa-methylated methylol melamine is particularly preferable in that excellent storage stability of the photosensitive layer can be assured, and it is useful in enhancing the surface hardness of the photosensitive layer or the film strength of the hardened film itself.

<Thermoplastic Elastomer>

The thermoplastic elastomer is not particularly limited and it may be suitably selected in accordance with the intended use. Examples thereof include a styrene based elastomer, an olefin based elastomer, a urethane based elastomer, a polyester based elastomer, a polyamide based elastomer, an acryl based elastomer, and a silicone based elastomer.

These elastomers consist of a hard segment component and a soft segment component. In general, the former contributes to heat resistance while the latter contributes to flexibility and toughness.

These elastomers are the same as those described in paragraph [0197] to [0207] of JP-A-2007-199532.

<Other Components>

The other components are not particularly limited and they may be suitably selected in accordance with the intended use. Examples thereof include a filler, a thermal hardening accelerator, a thermal polymerization inhibitor, a plasticizer, and a colorant (a coloring pigment or dye). In addition, an agent for promoting adhesion on surface of a substrate and other aids (for example, conductive particles, a bulking agent, an antifoaming agent, a leveling agent, a peeling agent, an antioxidant, a fragrance, a surface tension controlling agent, and a chain transfer agent, etc.) may be also used.

By suitably containing the components above, the stability, photographic property, physical properties of a film, etc. of a desired photosensitive film can be controlled.

As for the filler, detailed descriptions are given in paragraph [0098] and [0099] of JP-A-2008-250074, for example.

As for the thermal polymerization inhibitor, detailed descriptions are given in paragraph [0101] and [0102] of JP-A-2008-250074, for example.

As for the thermal hardening accelerator, detailed descriptions are given in paragraph [0093] of JP-A-2008-250074, for example.

As for the plasticizer, detailed descriptions are given in paragraph [0103] and [0104] of JP-A-2008-250074, for example.

As for the colorant, detailed descriptions are given in paragraph [0105] and [0106] of JP-A-2008-250074, for example.

As for the agent for promoting adhesion, detailed descriptions are given in paragraph [0107] to [0109] of JP-A-2008-250074, for example.

(Photosensitive Film)

The photosensitive film consists of at least a support and a photosensitive layer consisting of the photosensitive composition of the present invention on the support. In addition, it consists of other layers, if necessary.

—Support—

Material for the support is not particularly limited and may be suitably selected in accordance with the intended use. Preferably, the support exhibits a peeling ability against the photosensitive layer and a material having excellent light transmission is preferably used, and a material further having favorable surface planality is more preferably used.

The support is preferably made of a synthetic resin and is transparent. Examples thereof include various plastic films made of polyethylene terephthalates, polyethylene naphthalates, polypropylenes, polyethylenes, cellulose triacetates, cellulose diacetates, polyalkyl(meth)acrylate, poly(meth)acrylate ester copolymers, polyvinyl chlorides, polyvinyl alcohols, polycarbonates, polystyrenes, cellophanes, polyvinylidene chloride copolymers, polyamides, polyimides, copolymers between vinyl chloride and vinyl acetate, polytetrafluoroethylene, polytrifluoroethylene, cellulose-based films, and nylon films. Among them, polyethylene terephthalate is particularly preferable. Each of these synthetic resins may be used alone or in combination with two or more.

The thickness of the support is not particularly limited and may be suitably adjusted in accordance with the intended use; preferably, the thickness is 2 μm to 150 μm, more preferably 5 μm to 100 μm, and particularly preferably 8 μm to 50 μm.

The shape of the support is not particularly limited and may be suitably selected in accordance with the intended use, but the support is preferably formed in an elongated shape. The length of the elongated support is not particularly limited, and the ones elongated to 10 m to 20,000 m are exemplified.

—Photosensitive Layer—

The photosensitive layer is not particularly limited as long as it is a layer consisting of the photosensitive composition, and it may be suitably selected in accordance with the intended use.

In addition, the number of laminated layer in the photosensitive layer is not particularly limited and it may be suitably selected in accordance with the intended use. For example, it may be a single layer or two or more layers.

As for the method of forming a photosensitive layer, there is a method of dissolving, emulsifying, or dispersing the photosensitive composition of the present invention in water or a solvent to prepare the solution of the photosensitive composition, and directly coating the solution on the support followed by drying for lamination.

The solvent of the solution of the photosensitive composition is not particularly limited and may be appropriately selected depending on the purpose. Examples thereof include alcohols such as methanol, ethanol, n-propanol, isopropanol, n-butanol, sec-butanol, and n-hexanol; ketones such as acetone, methyl ethyl ketone, methyl isobutyl ketones, cyclohexanon, and diisobutyl ketone; esters such as ethyl acetates, butyl acetates, n-amyl acetate, methyl sulfate, ethyl propionate, dimethyl phthalate, ethyl benzoate, and methoxy propyl acetate; aromatic hydrocarbons such as toluene, xylene, benzene, and ethylbenzene; halogenated hydrocarbons such as carbon tetrachloride, trichloroethylene, chloroform, 1,1,1-trichloroethane, methylene chloride, and monochlorobenzene; ethers such as tetrahydrofuran, diethyl ether, ethylene glycol monomethylether, ethylene glycol monoethylether, and 1-methoxy-2-propanol; and dimethylformamide, dimethylacetoamide, dimethylsulfooxide, and sulfolane. These solvents may be used alone or in combination. A surfactant well known in the art may be also added.

The coating method is not particularly limited and it may be suitably selected in accordance with the intended use. Examples thereof include a direct coating on the support by using a spin coater, a slit spin coater, a roll coater, a die coater, or a curtain coater.

Condition for the drying may vary depending on each component, type of a solvent, and use ratio, etc., but it is for 30 sec to 15 min at the temperature of 60° C. to 110° C.

Thickness of the photosensitive layer is not particularly limited and it may be suitably selected in accordance with the intended use. For example, it is preferably from 1 μm to 100 μm, more preferably from 2 μm to 50 μm, and particularly preferably from 4 μm to 30 μm.

<Other Layer>

The other layers mentioned above are not particularly limited and they may be suitably selected in accordance with the intended use. Examples thereof include a protective film, a thermoplastic resin layer, a barrier layer, a peeling layer, an adhesive layer, a light-absorbing layer, and a surface protecting layer. The photosensitive film may have only one or two or more of those layers.

<<Protective Film>>

In the photosensitive film, the protective film is formed on the photosensitive layer.

Examples of the protective film include those used for the support, paper, and paper with polyethylene or polypropylene laminated thereon. Of these, polyethylene films and polypropylene films are preferable.

The thickness of the protective film is not particularly limited and may be suitably selected in accordance with the intended use, and for example, the thickness is preferably 5 µm to 100 µm, more preferably 8 µm to 50 µm, and still more preferably 10 µm to 30 µm.

The combinations of the support and the protective film, i.e. (support/protective film), are exemplified by (polyethylene terephthalate/polypropylene), (polyethylene terephthalate/polyethylene), (polyvinyl chloride/cellophane), (polyimide/polypropylene), and (polyethylene terephthalate/polyethylene terephthalate). An adhesivity between layers can be controlled by treating surface of at least any one of the support and the protective film. The surface treatment of the support may be provided to increase the adhesive force with the photosensitive layer. Examples of the surface treatment of the support include forming an undercoat layer, corona discharge treatment, flame treatment, ultraviolet ray irradiation treatment, radiofrequency irradiation treatment, glow discharge treatment, active plasma irradiation treatment, and laser beam irradiation treatment.

The coefficient of static friction between the support and the protective film is preferably 0.3 to 1.4, and more preferably 0.5 to 1.2. When the coefficient of static friction is 0.3 or more, rolling displacement due to excessive slippage may be prevented, and when the coefficient of static friction is 1.4 or less, it can be wound in favorable roll form.

It is preferable that the photosensitive film is wound to a cylindrical core tube and storage in a elongated roll shape. The length of the elongated photosensitive film is not particularly limited and may be suitably selected from 10 m to 20,000 m, for example. The photosensitive film may be subjected to slit processing in a user-friendly manner to be elongated roll shape of 100 m to 1,000 m. In this case, it is preferable that the photosensitive film is wound to a cylindrical core tube such that the support constitutes the outermost of the roll. Further, the rolled photosensitive film may be slit in sheet-like shape. During storage period, preferably a separator which is preferably moisture proof and contains a drying agent is arranged at the edge faces from the perspective of protection of the edge faces and preventing edge fusion; and a material of lower moisture vapor permeability is preferably used for packaging.

The protective film may be subjected to a surface treatment in order to control the adhesive property between the protective film and the photosensitive layer. The surface treatment can be performed, for example, by forming an under-coat layer of polymer such as polyorganosiloxane, fluorinated polyolefin, polyfluoroethylene, and polyvinyl alcohol on the surface of the protective film. The under-coat layer can be formed by applying the coating solution of the polymer over the surface of the protective film, then drying the coated surface at 30° C. to 150° C., in particular 50° C. to 120° C., for 1 minute to 30 minutes.

(Photosensitive Laminate)

The photosensitive laminate consists of at least a substrate and a photosensitive layer formed on the substrate, and it also consists of other laminated layers that may be suitably selected in accordance with the intended use.

The photosensitive layer is transferred from a photosensitive film produced according to the production method described above, and it has the same constitution as defined above.

<Substrate>

The substrate serves as an object to be treated on which a photosensitive layer is formed or an object to be transferred on which at least the photosensitive layer of the photosensitive film of the present invention is transferred, and it is not particularly limited and may be suitably selected in accordance with the intended use. For example, the substrate may be arbitrarily selected from among those having a high surface planality to those having a concavoconvex surface. A sheet-like base is preferably used, and a so-called board is used as the base. Specific examples thereof include conventional board for producing printed wiring board, glass plates (soda glass plates, etc.), synthetic resin films, paper, and metal plates.

<Method for Producing a Photosensitive Laminate>

As a method for producing the photosensitive laminate, a method of transferring and laminating, while performing at least one of heating and pressurizing, at least the photosensitive layer of the photosensitive film of the present invention can be exemplified.

According to the method for producing a photosensitive laminate, the photosensitive film of the present invention is laminated on a surface of the substrate while performing any one of heating and pressurizing the photosensitive film to thereby form a photosensitive layer on the substrate surface. When the photosensitive film has the protective film, it is preferable that the protective film is peeled off from the substrate, and the photosensitive film is formed on the substrate surface such that the photosensitive layer is overlapped.

The heating temperature is not particularly limited and may be suitably selected in accordance with the intended use. For example, the heating temperature is preferably 15° C. to 180° C., and more preferably 60° C. to 140° C.

The pressure at the pressurization is not particularly limited and may be suitably selected in accordance with the intended use. For example, the pressure is preferably 0.1 MPa to 1.0 MPa, and more preferably 0.2 MPa to 0.8 MPa.

The apparatus used to perform any one of heating and pressurizing is not particularly limited and may be suitably selected in accordance with the intended use. For example, a laminator (trade name: VP-II (manufactured by Taisei Laminator Co., Ltd.), trade name: VP130 (manufactured by Nichigo-Morton Co., Ltd.)) is preferably exemplified.

The photosensitive film and the photosensitive laminate of the present invention have even film thickness and extremely low occurrence ratio of plane defect, such as pinholes or crawling, and therefore have excellent insulation reliability and allow effective formation of a highly precise permanent pattern (protective film, interlayer insulating film, and solder resist pattern, etc.) thereon. As such, it can be widely used for forming a highly precise permanent pattern in the field of electronic materials, and in particular, for forming a permanent pattern on a printed board.

(Method of Forming a Permanent Pattern)

The method of forming a permanent pattern of the present invention includes at least an exposing step, and it includes other step, for example, a developing step, that may be suitably selected depending on necessity.

<Exposing Step>

The exposing step is a step in which the photosensitive layer in photosensitive laminate of the present invention is exposed. The photosensitive laminate of the present invention is as described above.

The target of the exposure is not particularly limited and may be suitably selected in accordance with the intended use as long as the target is a photosensitive layer in the photosensitive laminate. For example, as described in the above, it is preferable to perform the step on a laminate which is formed by lamination with performing at least one of heating and pressurizing the photosensitive film on the substrate.

The exposing is not particularly limited and may be suitably selected in accordance with the intended use, and digital exposure and analog exposure are exemplified. Among them, analog exposure is preferable.

<Other Steps>

The other step is not particularly limited and it may be suitably selected in accordance with the intended use. Examples thereof include a substrate surface treatment step, a developing step, a hardening treatment step, and a post exposing step.

<<Developing Step>>

The developing step is the step of removing unexposed regions of the photosensitive layer.

The method of removing unexposed regions is not particularly limited and may be suitably selected in accordance with the intended use, and examples thereof include a method of removing unexposed regions using a developer.

The developer is not particularly limited and may be suitably selected in accordance with the intended use. Examples of the developer include alkaline aqueous solutions, aqueous developing liquids, and organic solvents. Among these, weak alkali aqueous solutions are particularly preferable. Examples of the basic components of the weak alkali aqueous solutions include lithium hydroxide, sodium hydroxide, potassium hydroxide, lithium carbonate, sodium carbonate, potassium carbonate, lithium hydrogencarbonate, sodium hydrogencarbonate, potassium hydrogencarbonate, sodium phosphate, potassium phosphate, sodium pyrophosphate, potassium pyrophosphate, and borax.

The weak alkali aqueous solution preferably exhibits a pH of about 8 to 12, more preferably about 9 to 11. Examples of such a solution are aqueous solutions of sodium carbonate or potassium carbonate at a concentration of 0.1% by mass to 5% by mass.

The temperature of the developer may be properly selected depending on the developing ability of the developer; for example, the temperature of the developer is about 25° C. to 40° C.

The developer may be combined with surfactants, defoamers; organic bases such as ethylene diamine, ethanol amine, tetramethylene ammonium hydroxide, diethylene triamine, triethylene pentamine, morpholine, and triethanol amine; organic solvents to promote developing such as alcohols, ketones, esters, ethers, amides, and lactones. The developer set forth above may be an aqueous developer prepared by mixing water or aqueous alkali solutions and organic solvents, or may be an organic solution itself.

<<Hardening Treatment Step>>

The hardening treatment step is a step of hardening the photosensitive layer of the pattern formed after developing step.

The hardening treatment step is not particularly limited and may be suitably selected in accordance with the intended use. For example, an entire surface exposing treatment, and an entire surface heating treatment are preferably exemplified.

For the method of subjecting the photosensitive layer to the entire surface exposing treatment, a method is exemplified in which after the developing step, the entire surface of the photosensitive laminate with the permanent pattern formed thereon is exposed. Exposing the entire surface of the photosensitive laminate accelerates hardening of the resin in the photosensitive composition which forms the photosensitive layer to thereby harden the surface of the permanent pattern.

An apparatus to perform the exposure of the entire surface is not particularly limited and may be suitably selected in accordance with the intended use. Preferred examples of the apparatus include UV exposers such as ultrahigh pressure mercury lamp.

For the method of subjecting the photosensitive layer to the entire surface heating treatment, a method is exemplified in which after the developing step, the entire surface of the photosensitive laminate with the permanent pattern formed thereon is heated. Heating the entire surface of the photosensitive laminate can enhance the film strength of the permanent pattern surface.

The heating temperature of the entire surface heating is preferably 120° C. to 250° C., and more preferably 120° C. to 200° C. When the heating temperature is 120° C. or more, the film strength is improved. When the heating temperature is 250° C. or less, deterioration in film quality due to degradation of a resin in the photosensitive composition can be prevented.

The heating time in the entire surface heating treatment is preferably 10 minutes to 120 minutes, and more preferably 15 minutes to 60 minutes.

An apparatus to perform the entire surface heating is not particularly limited and may be suitably selected from among conventional apparatuses. For example, dry oven, hot plate, IR heater are exemplified.

When the method of forming a permanent pattern is a method of forming at least one of protective film, interlayer insulating film, and solder resist pattern, etc., it is possible to form a permanent pattern on a printed wiring board by using the method of forming a permanent pattern and carry out soldering as described below.

In other words, a hardened layer which is the permanent pattern is formed in the developing step, and a metal layer is exposed on the surface of the printed wiring board. The regions of the metal layer exposed on the surface of the printed wiring board are plated with gold and is then soldered. On the soldered regions, semiconductor, components and the like are mounted. At this point in time, the permanent pattern made of the hardened layer exerts a function as a protective film or an insulating film (interlayer insulating film) to block external impact shock and conduction between neighboring electrodes.

(Printed Board)

The printed board of the present invention consists of at least a substrate and a permanent pattern formed by the method of forming a permanent pattern described above, and it may have an additional constitution that is suitably selected depending on necessity.

The additional constitution is not particularly limited and it may be suitably selected in accordance with the intended use. For example, there is a built-up board in which an insulating layer is further formed between the substrate and the permanent pattern.

EXAMPLES

The present invention will be described in more detail based on examples given below, but the invention is not meant to be limited by these.

In the following examples, the acid value, weight average molecular weight, and equivalent to vinyl group, of the carboxyl group-containing photosensitive polyurethane resin, are measured as described below.

<Measurement of Acid Value>

The acid value was measured according to JIS K0070. However, when the sample was not dissolved, dioxane or tetrahydrofuran was used as a solvent.

<Measurement of Weight Average Molecular Weight>

The weight average molecular weight was measured with a high speed GPC apparatus (trade name: HLC-802A, manufactured by Toyo Soda Co., Ltd.), by using 0.5% by mass THF solution as a sample solution and sixty-two TSKgel GMH as a column, injecting 200 µL of a test sample, eluting with the THF solution, and detecting at 25° C. by a refractometer. Then, from the molecular weight distribution curve calibrated against the standard polystyrene, the weight average molecular weight was determined.

<Measurement of Equivalent to an Ethylenically Unsaturated Group>

The equivalent to an ethylenically unsaturated group was determined by measuring a bromine number according to JIS K2605.

Synthetic Example 1

Synthesis of Carboxyl Group-Containing Photosensitive Polyurethane Resin U1

In a 500 mL three-neck round-bottomed flask equipped with a condenser and a stirrer, 10.24 g (0.065 mole) of glycerol monomethacrylate (GLM), 2.61 g (0.019 mole) of malic acid, 7.38 g (0.055 mole) of 2,2-his(hydroxymethyl)butanoic acid (DMBA), and 15.87 g (0.023 mole) of polypropylene glycol (molecular weight: 700) (PPG700) were dissolved in 102 mL of cyclohexanone. Thereto, 32.65 g (0.130 mole) of 4,4-diphenylmethane diisocyanate (MDI), 5.51 g (0.032 mole) of hexamethylene diisocyanate (HMDI), 0.1 g of 2,6-di-t-butylhydroxytoluene, and 0.2 g of a catalyst (trade name: NEOSTANN U-600, manufactured by Nitto Kasei Co., Ltd.) were added, followed by stirring for 5 hours under heating at 75° C. After that, the resultant reaction mixture was diluted with 9.75 mL of methyl alcohol, followed by stirring for 30 min, to obtain 190 g of a polyurethane resin U1 solution (solid content: 40% by mass).

The thus-obtained carboxyl group-containing photosensitive polyurethane resin U1 had a solid component acid value of 41.5 mg KOH/g, a weight average molecular weight (standard material: polystyrene) of 12,000, and an ethylenically unsaturated group equivalent of 0.87 mmol/g.

Synthetic Example 2

Synthesis of Carboxyl Group-Containing Photosensitive Polyurethane Resin U2

The carboxyl group-containing photosensitive polyurethane resin U2 solution (solid component concentration: 40% by mass) was synthesized in the same manner as in Synthetic Example 1, except that 10.24 g (0.065 mole) of glycerol monomethacrylate (GLM), 2.61 g (0.019 mole) of malic acid, 7.38 g (0.055 mole) of 2,2-bis(hydroxymethyl)butanoic acid (DMBA), and 15.87 g (0.023 mole) of polypropylene glycol (molecular weight: 700) (PPG700) in Synthetic Example 1 were changed to 7.66 g (0.048 mole) of glycerol monomethacrylate (GLM), 2.17 g (0.016 mole) of malic acid, 5.77 g (0.043 mole) of 2,2-bis(hydroxymethyl)butanoic acid (DMBA), and 26.93 g (0.027 mole) of polypropylene glycol (molecular weight: 1,000) (PPG1000), and that 32.65 g (0.130 mole) of 4,4-diphenylmethane diisocyanate (MDI) and 5.51 g (0.032 mole) of hexamethylene diisocyanate (HMDI) in Synthetic Example 1 were changed to 27.14 g (0.108 mole) of 4,4-diphenylmethane diisocyanate (MDI) and 4.58 g (0.027 mole) of hexamethylene diisocyanate (HMDI).

The thus-obtained carboxyl group-containing photosensitive polyurethane resin U2 had a solid component acid value of 32.5 mg KOH/g, a weight average molecular weight of 14,000, and an ethylenically unsaturated group equivalent of 0.65 mmol/g.

Synthetic Example 3

Synthesis of Carboxyl Group-Containing Photosensitive Polyurethane Resin U3

The carboxyl group-containing photosensitive polyurethane resin U3 solution (solid component concentration: 40% by mass) was synthesized in the same manner as in Synthetic Example 1, except that 10.24 g (0.065 mole) of glycerol monomethacrylate (GLM), 2.61 g (0.019 mole) of malic acid, 7.38 g (0.055 mole) of 2,2-bis(hydroxymethyl)butanoic acid (DMBA), and 15.87 g (0.023 mole) of polypropylene glycol (molecular weight: 700) (PPG700) in Synthetic Example 1 were changed to 8.63 g (0.055 mole) of glycerol monomethacrylate (GLM), 2.17 g (0.016 mole) of malic acid, 5.77 g (0.043 mole) of 2,2-bis(hydroxymethyl)butanoic acid (DMBA), and 27.31 g (0.018 mole) of polypropylene glycol (molecular weight: 1,500) (PPG 1500), and that 32.65 g (0.130 mole) of 4,4-diphenylmethane diisocyanate (MDI) and 5.51 g (0.032 mole) of hexamethylene diisocyanate (HMDI) in Synthetic Example 1 were changed to 26.22 g (0.104 mole) of 4,4-diphenylmethane diisocyanate (MDI) and 4.42 g (0.026 mole) of hexamethylene diisocyanate (HMDI).

The thus-obtained carboxyl group-containing photosensitive polyurethane resin U3 had a solid component acid value of 31.4 mg KOH/g, a weight average molecular weight of 15,000, and an ethylenically unsaturated group equivalent of 0.74 mmol/g.

Synthetic Example 4

Synthesis of Carboxyl Group-Containing Photosensitive Polyurethane Resin U4

The carboxyl group-containing photosensitive polyurethane resin U4 solution (solid component concentration: 40% by mass) was synthesized in the same manner as in Synthetic Example 1, except that 10.24 g (0.065 mole) of glycerol monomethacrylate (GLM), 2.61 g (0.019 mole) of malic acid, 7.38 g (0.055 mole) of 2,2-bis(hydroxymethyl)butanoic acid (DMBA), and 15.87 g (0.023 mole) of polypropylene glycol (molecular weight: 700) (PPG700) in Synthetic Example 1 were changed to 8.70 g (0.055 mole) of glycerol monomethacrylate (GLM), 2.11 g (0.016 mole) of malic acid, 6.33 g (0.047 mole) of 2,2-bis(hydroxymethyl)butanoic acid (DMBA), and 26.22 g (0.013 mole) of polypropylene glycol (molecular weight: 2,000) (PPG2000), and that 32.65 g (0.130 mole) of 4,4-diphenylmethane diisocyanate (MDI) and 5.51 g (0.032 mole) of hexamethylene diisocyanate (HMDI) in Synthetic Example 1 were changed to 26.43 g (0.105 mole) of 4,4-diphenylmethane diisocyanate (MDI) and 4.46 g (0.026 mole) of hexamethylene diisocyanate (HMDI).

The thus-obtained carboxyl group-containing photosensitive polyurethane resin U4 had a solid component acid value of 35.6 mg KOH/g, a weight average molecular weight of 16,000, and an ethylenically unsaturated group equivalent of 0.74 mmol/g.

Synthetic Example 5

Synthesis of Carboxyl Group-Containing Photosensitive Polyurethane Resin U5 for Comparison The carboxyl group-containing photosensitive polyurethane resin U5 solution (solid component concentration: 40% by mass) was synthesized in the same manner as in Synthetic Example 1, except that 10.24 g (0.065 mole) of glycerol monomethacrylate (GLM), 2.61 g (0.019 mole) of malic acid, 7.38 g (0.055 mole) of 2,2-bis(hydroxymethyl)butanoic acid (DMBA), and 15.87 g (0.023 mole) of polypropylene glycol (molecular weight: 700) (PPG700) in Synthetic Example 1 were changed to 0.36 g (0.002 mole) of glycerol monomethacrylate (GLM), 1.85 g (0.014 mole) of malic acid, 8.30 g (0.062 mole) of 2,2-bis(hydroxymethyl)butanoic acid (DMBA), and 36.71 g (0.037 mole) of polypropylene glycol (molecular weight: 1,000) (PPG 1000), and that 32.65 g (0.130 mole) of 4,4-diphenylmethane diisocyanate (MDI) and 5.51 g (0.032 mole) of hexamethylene diisocyanate (HMDI) in Synthetic Example 1 were changed to 23.13 g (0.092 mole) of 4,4-diphenylmethane diisocyanate (MDI) and 3.90 g (0.023 mole) of hexamethylene diisocyanate (HMDI).

The thus-obtained carboxyl group-containing photosensitive polyurethane resin U5 had a solid component acid value of 46.7 mg KOH/g, a weight average molecular weight of 16,000, and an ethylenically unsaturated group equivalent of 0.03 mmol/g.

Synthetic Example 6

Synthesis of Carboxyl Group-Containing Photosensitive Polyurethane resin U6 for Comparison The carboxyl group-containing photosensitive polyurethane resin U6 solution (solid component concentration: 40% by mass) was synthesized in the same manner as in Synthetic Example 1, except that 10.24 g (0.065 mole) of glycerol monomethacrylate (GLM), 2.61 g (0.019 mole) of malic acid, 7.38 g (0.055 mole) of 2,2-bis(hydroxymethyl)butanoic acid (DMBA), and 15.87 g (0.023 mole) of polypropylene glycol (molecular weight: 700) (PPG700) in Synthetic Example 1 were changed to 6.44 g (0.041 mole) of glycerol monomethacrylate (GLM), 1.82 g (0.014 mole) of malic acid, 3.04 g (0.023 mole) of 2,2-bis(hydroxymethyl)butanoic acid (DMBA), and 36.25 g (0.036 mole) of polypropylene glycol (molecular weight: 1,000) (PPG1000), and that 32.65 g (0.130 mole) of 4,4-diphenylmethane diisocyanate (MDI) and 5.51 g (0.032 mole) of hexamethylene diisocyanate (HMDI) in Synthetic Example 1 were changed to 22.84 g (0.091 mole) of 4,4-diphenylmethane diisocyanate (MDI) and 3.85 g (0.023 mole) of hexamethylene diisocyanate (HMDI).

The thus-obtained carboxyl group-containing photosensitive polyurethane resin U6 had a solid component acid value of 17.1 mg KOH/g, a weight average molecular weight of 13,500, and an ethylenically unsaturated group equivalent of 0.55 mmol/g.

Synthetic Example 7

Synthesis of Carboxyl Group-Containing Photosensitive Polyurethane Resin U7 for Comparison In a 500 mL three-neck round-bottomed flask equipped with a condenser and a stirrer, 32.00 g (0.216 mole) of 2,2-bis(hydroxymethyl)propionic acid (DMBA) and 9.00 g (0.009 mole) of polypropylene glycol (molecular weight: 1,000) (PPG1000) were dissolved in 118 mL of propylene glycol monomethyl ether monoacetate. Thereto, 37.54 g (0.15 mole) of 4,4-diphenylmethane diisocyanate (MDI), 0.1 g of 2,6-di-t-butylhydroxytoluene, and 0.2 g of a catalyst (trade name: NEOSTANN U-600, manufactured by Nitto Kasei Co., Ltd.) were added, followed by stirring for 5 hours at 75° C. and then further followed by addition of 9.61 g of methyl alcohol. After that, thereto, 17.91 g (0.126 mole) of glycidyl methacrylate (GMA) as an epoxy having an ethylenically unsaturated group, and 5,000 ppm of triphenylphosphine as a catalyst, were further added, followed by stirring for 5 hours at 110° C. and then cooling the resultant reaction mixture to room temperature, to obtain 214 g of the carboxyl group-containing photosensitive polyurethane resin U7 solution (solid component concentration: 40% by mass).

The thus-obtained carboxyl group-containing photosensitive polyurethane resin U7 had a solid component acid value of 75 mg KOH/g, a weight average molecular weight of 12,000, and an ethylenically unsaturated group equivalent of 1.3 mmol/g.

Synthetic Example 8

Synthesis of Carboxyl Group-Containing Photosensitive Polyurethane Resin U8 for Comparison The carboxyl group-containing photosensitive polyurethane resin U8 solution (solid component concentration: 40% by mass) was synthesized in the same manner as in Synthetic Example 7, except that 37.54 g (0.15 mole) of 4,4-diphenylmethane diisocyanate (MDI) was replaced with a combination of 30.03 g (0.12 mole) of 4,4-diphenylmethane diisocyanate (MDI) and 5.05 g (0.03 mole) of hexamethylene diisocyanate (HMDI), that a combination of 32.00 g (0.216 mole) of 2,2-bis(hydroxymethyl)propionic acid (DMBA) and 9.00 g (0.009 mole) of polypropylene glycol (molecular weight: 1,000) (PPG1000) was replaced with a combination of 28.17 g (0.21 mole) of 2,2-bis(hydroxymethyl)propionic acid (DMPA) and 6.00 g (0.015 mole) of polypropylene glycol (molecular weight: 400) (PPG400), that 17.91 g (0.126 mole) of glycidyl methacrylate (GMA) as the epoxy having an ethylenically unsaturated group was replaced with 0.126 mole of CYCLOMER M100 (trade name, manufactured by Daicel Chemical Industries, Ltd.), and that the volume of propylene glycol monomethyl ether monoacetate was changed from 118 mL to 112 mL.

The thus-obtained carboxyl group-containing photosensitive polyurethane resin U8 had a solid component acid value of 90 mg KOH/g, a weight average molecular weight of 15,000, and an ethylenically unsaturated group equivalent of 1.1 mmol/g.

Synthetic Example 9

Synthesis of Carboxyl Group-Containing Photosensitive Polyurethane Resin U9 for Comparison The carboxyl group-containing photosensitive polyurethane resin U9 solution (solid component concentration: 40% by mass) was synthesized in the same manner as in Synthetic Example 7, except that 37.54 g (0.15 mole) of 4,4-diphenylmethane diisocyanate (MDI) was replaced with a combination of 30.03 g (0.12 mole) of 4,4-diphenylmethane diisocyanate (MDI) and 5.05 g (0.03 mole) of hexamethylene diisocyanate (HMDI), that a combination of 32.00 g (0.216 mole) of 2,2-bis(hydroxymethyl)propionic acid (DMBA) and 9.00 g (0.009 mole) of polypropylene glycol (molecular weight: 1,000) (PPG1000) was replaced with a combination of 22.13 g (0.165 mole) of 2,2-bis(hydroxymethyl)propionic acid (DMPA) and 12.00 g (0.03 mole) of polypropylene glycol (molecular weight: 400) (PPG400), that 17.91 g (0.126 mole) of glycidyl methacrylate (GMA) as the epoxy having an ethylenically unsaturated group was replaced with 0.126 mole of CYCLOMER A400 (trade name, manufactured by Daicel Chemical Industries, Ltd.), and that the volume of propylene glycol monomethyl ether monoacetate was changed from 118 mL to 101 mL.

The thus-obtained carboxyl group-containing photosensitive polyurethane resin U9 had a solid component acid value of 60 mg KOH/g, a weight average molecular weight of 9,000, and an ethylenically unsaturated group equivalent of 0.8 mmol/g.

Synthetic Example 10

Synthesis of Carboxyl Group-Containing Photosensitive Polyurethane Resin U10 for Comparison In a vessel, 475 parts by mass of YDF2001 (trade name, manufactured by Tohto Kasei Co., Ltd., a bisphenol F-type epoxy resin, X=a glycidyl group and R=H in formula (II)), 72 parts by mass of acrylic acid, 0.5 parts by mass of hydroquinone, and 120 parts by mass of carbitol acetate were added, followed by stirring under heating at 90° C., to dissolve the reaction mixture. Then, the reaction mixture was cooled to 60° C., followed by adding thereto 2 parts by mass of chlorobenzyl trimethyl ammonium, and heating to 100° C., to allow reaction until the acid value would become 1 mg KOH/g. Then, thereto, 98 parts by mass of maleic anhydride and 85 parts by mass of carbitol acetate were added, followed by heating to 80° C., to allow reaction for about 6 hours. Then, after cooling, the resultant mixture was diluted with carbitol acetate to the solid component concentration of 40% by mass, to obtain an acid-modified epoxy resin containing an ethylenically unsaturated group of Synthetic Example U10.

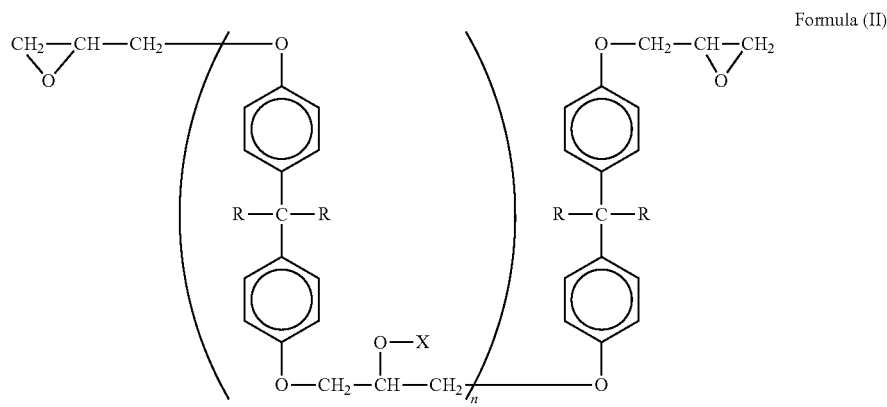

Formula (II)

Example 1

—Production of Photosensitive Film—

Onto a polyethylene terephthalate film with thickness 16 μm (trade name: 16FB50, manufactured by Toray Industries, Inc.) as a support, a photosensitive composition solution having the composition below was applied, followed by drying, to form a photosensitive layer with thickness 30 μm on the support. On the resultant photosensitive layer, a polypropylene film with thickness 20 μm (trade name: ALPHAN E-200, manufactured by Oji Specialty Paper Co., Ltd.), as a protective layer, was laminated, to produce a photosensitive film.

To the thus-obtained polyimide with copper foil line pattern, the above-produced photosensitive layer was laminated to the side of the copper foil line pattern, followed by subjecting to exposure to light at 1,000 mJ, to obtain a laminate for evaluation.

The resultant laminate for evaluation was bent at 180 degrees with the line pattern side facing the outside. A weight

| -Composition of photosensitive composition solution- | |
|---|---|
| Carboxyl group-containing photosensitive polyurethane resin U1 solution of Synthetic Example 1 (solid component concentration: 40% by mass) | 46.8 mass parts |
| Polymerizable compound (trade name: DCP-A, manufactured by Kyoei Kagaku Co., Ltd.) | 7.7 mass parts |
| Thermo-crosslinking agent (trade name: EPOTOHTO YDF-170, manufactured by Tohto Kasei Co., Ltd., Bisphenol-F type epoxy resin) | 4.18 mass parts |
| Photopolymerization initiator represented by the following formula (trade name: IRGACURE 907, manufactured by Ciba Specialty Chemicals) | 0.8 mass part |

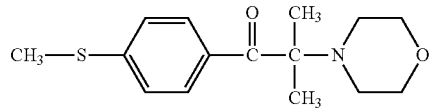

Molecular Weight: 2794

| | |
|---|---|
| Metal phosphate (trade name: OP-935, manufactured by Clariant (Japan) K.K.) | 8.4 mass parts |
| Coloring pigment (trade name: HELIOHGEN BLUE D7086, manufactured by BASF Corporation) | 0.03 mass part |
| Coloring pigment (trade name: Pariotol Yellow D0960, manufactured by BASF Corporation) | 0.009 mass part |
| Hardener (melamine) | 0.23 mass part |
| Sensitizing dye (trade name: DETX-S, manufactured by BASF Corporation) | 0.008 mass part |
| Reaction aid (trade name: EAB-F, manufactured by Hodogaya Chemical Co., Ltd.) | 0.028 mass part |
| Elastomer (trade name: ESPEL 1612, manufactured by Hitachi Chemical Co., Ltd.) | 11.8 mass parts |
| Coating aid (trade name: MEGAFAC F-780F, manufactured by DIC Corporation) | 3.3 mass parts |
| Cyclohexanone | 16.7 mass parts |

—Lamination on Substrate—

The surface of a copper clad laminate (no through hole, copper thickness 12 μm) was subjected to chemical polishing, to prepare a substrate. On the thus-obtained copper clad laminate, the photosensitive film was laminated, by using a vacuum laminator (trade name: VP130, manufactured by Nichigo-Morton Co., Ltd.), while peeling the protective film off from the photosensitive film so that the photosensitive layer of the photosensitive film would attach with the copper clad laminate, to produce a laminate in which the copper clad laminate, the photosensitive layer, and the polyethylene terephthalate film (i.e., the support) were laminated in this order.

The compression-binding condition includes vacuum time of 40 sec, compression temperature of 70° C., compression pressure of 0.2 MPa, and compression time period of 10 sec.

With respect to the thus-obtained laminate, bending resistance and flame retardancy were evaluated as follows. The results are shown in Table 1.

<Bending Resistance>

For measuring bending resistance, a dry film resist was laminated on a board for a flexible printing wiring (trade name: ESPANEX MB series, manufactured by Nippon Steel Chemical Co., Ltd.) in which a copper foil with thickness 18 μm was laminated on a polyimide substrate (thickness 25 μm). The resultant laminate was subjected to exposure to light at 200 mJ, followed by development under the condition of 0.15 MPa/90 s, to produce a line pattern with Line/Space=100/100 μm.

of 100 g, 200 g, or 250 g was hung on the resultant bent portion, and the bending resistance was evaluated according to the following criteria.

[Evaluation Criteria]

◉: A sample which withstood 250 g

○: A sample which withstood 200 g, but which did not withstand 250 g

Δ: A sample which withstood 100 g, but which did not withstand 200 g

×: A sample which did not withstand 100 g

<Flame Retardancy>

A flexible printed wiring board (trade name: ESPANEX MB series, manufactured by Nippon Steel Chemical Co., Ltd.) laminated on a polyimide substrate (polyimide thickness 12.5 μm and copper foil thickness 18 μm) was subjected to etching, to remove the copper foil, to obtain a polyimide substrate with thickness 12.5 μm.

On each surface of the resultant polyimide substrate, the photosensitive film produced (thickness 38 μm) was adhered by lamination.

The thus-obtained polyimide substrate with the photosensitive films were cut to have a size of 20 cm×5 cm, to give a composite sample. The resultant composite sample was wrapped around a cylindrical rod (diameter 1 cmφ×20 cm). One end of the composite sample was fixed with a heat-resistant tape. By pulling out the rod, a sample for testing flame retardancy was obtained (length 20 cm and diameter 1 cm).

The thus-obtained sample for testing flame retardancy was hung by using a clamp, and brought into contact with 3-cm flame for 3 seconds, to carry out the flame retardancy test.

[Evaluation Criteria]

⦿: A sample which did not burn at all

○: A sample which burnt, but the flame extinguished within 3 seconds

Δ: A sample which burnt, but the flame extinguished within a time period of more than 3 seconds but not more than 5 seconds ×: A sample which burnt, but the flame extinguished within a time period of more than 5 seconds but not more than 10 seconds NOT: A sample which burnt away completely <Resolution>

The photosensitive laminate was kept for 10 minutes at room temperature (23° C.) and 55% RH. The polyethylene terephthalate film (support) of the resultant photosensitive laminate was subjected to exposure to light, so that round holes would be formed to have diameters 80 μm to 200 μm, by using a round hole pattern, with the pattern forming apparatus described above.

The exposure amount was an amount of light energy required for hardening the photosensitive layer of the photosensitive film in the sensitivity evaluation test described above. After keeping the thus-exposed laminate at room temperature for 10 minutes, the polyethylene terephthalate film (support) was peeled off from the photosensitive laminate.

Over the entire surface of the photosensitive layer on copper clad laminate, 1% by mass aqueous solution of sodium carbonate at 30° C., as the developer, was sprayed with spray pressure 0.15 MPa, for the time period that was two times longer than the shortest development time period described above, to dissolve and remove the non-hardened region.

The surface of the thus-obtained copper clad laminate with a cured resin pattern was observed under an optical microscope. For a round hole pattern in which no abnormality, such as burr at or peeling off, of a pattern part was found and a space was able to be formed, the minimum round hole pattern width was measured, which was determined as the resolution. The evaluation was made according to the following criteria. The smaller the measured resolution value (i.e. the diameter under the criteria) is, the better the resolution is.

[Evaluation Criteria]

⦿: Excellent resolution, which can resolve a round hole with diameter 100 μm or less ○: Favorable resolution, which can resolve a round hole with diameter more than 100 μm but not more than 150 μm Δ: Slightly poor resolution, which can resolve a round hole with diameter more than 150 μm but not more than 200 μm ×: Poor resolution, which cannot resolve any round hole <Insulation Reliability>

A copper foil with thickness 12 μm was laminated on a glass epoxy substrate, to give a printed board, and the resultant copper foil was subjected to etching, to form interdigitated electrodes, which faced each other on the same surface, in which the line width/space width was 50 μm/50 μm and the respective line was not in contact with each other. On the interdigitated electrode on the board, a solder resist layer was formed in a usual manner, followed by subjecting to exposure to light with optimum exposure amount (100 mJ/cm$^2$ to 800 mJ/cm$^2$). Then, after keeping at ordinary temperature for 1 hour, the resultant layer was subjected to spray development for 60 sec with 1% by mass aqueous solution of sodium carbonate at 30° C., followed by heating (drying) at 80° C. for 10 minutes. Then, by using an UV irradiator, manufactured by ORC Manufacturing Co., Ltd., UV irradiated to the photosensitive layer with an energy amount of 1 J/cm$^2$. After heat-treatment at 120° C. for 60 minutes, the resultant photosensitive layer was subjected to further heat-treatment at 160° C. for 60 minutes, to obtain a board for evaluation on which a solder resist was formed.

To apply a voltage between the interdigitated electrodes in the laminate for evaluation obtained after the heat-treatment, a shield line made of polytetrafluoroethylene was connected to the interdigitated electrodes by Sn/Pn soldering. After that, while a 5-V voltage was applied to the laminate for evaluation, the laminate for evaluation was kept in a super-accelerated high-temperature and high-humidity bias life test (HHBT) bath at 85° C. and 85% RH for 300 hours. Thereafter, degree of occurrence of migration to the solder resist in the laminate for evaluation was observed with a metal microscope with a magnification of 100×.

[Evaluation Criteria]

⦿: Excellent insulating property, in which no occurrence of migration was found

○: Favorable insulating property, in which occurrence of slight migration was found on the copper Δ: Slightly poor insulating property, in which occurrence of migration was found ×: Poor insulating property, in which short circuit occurred between the electrodes <Warp>

On a polyimide (10 cm×10 cm) with thickness 25 μm, a solder resist layer was formed in a usual manner, followed by subjecting to exposure to light with optimum exposure amount (100 mJ/cm$^2$ to 800 mJ/cm$^2$). Then, after keeping at ordinary temperature for 1 hour, the resultant layer was subjected to spray development for 60 sec with 1% by mass aqueous solution of sodium carbonate at 30° C., followed by heating (drying) at 80° C. for 10 minutes. Then, by using an UV irradiator, manufactured by ORC Manufacturing Co., Ltd., UV was irradiated to the photosensitive layer with an energy amount of 1 J/cm$^2$. After heat-treatment at 120° C. for 60 minutes, the resultant photosensitive layer was subjected to further heat-treatment at 160° C. for 60 minutes, to obtain a board for evaluation on which a solder resist was formed. Warp of the board was measured before and after the heat treatment. For measuring warp, the convex side of the board for evaluation was set to face a horizontal measuring table, so that the convex surface of the board for evaluation was brought into contact with the measuring table. From the concave surface of the board for evaluation, the longest distance to the measuring table (i.e. from the tip portion of the board for evaluation) was measured.

[Evaluation Criteria]

⦿: Warp width was less than 1 cm.

○: Warp width was not less than 1 cm and less than 2 cm.

Δ: Warp width was not less than 2 cm and less than 5 cm.

×: Warp width was 5 cm or more.

Examples 2 to 4

The respective photosensitive films, laminates, and permanent patterns of Examples 2 to 4 were produced in the same manner as in Example 1, except that the carboxyl group-containing photosensitive polyurethane resin U1 solution (solid component concentration: 40% by mass) of Synthetic Example 1 was changed to the carboxyl group-containing photosensitive polyurethane resin U2 to U4 solutions of Synthetic Examples 2 to 4, respectively.

The thus-obtained respective laminates were subjected to the evaluations in the same manner as in Example 1. The results are shown in Table 1.

Comparative Examples 1 to 6

The respective photosensitive films, laminates, and permanent patterns of Comparative Examples 1 to 6 were produced in the same manner as in Example 1, except that the carboxyl group-containing photosensitive polyurethane resin U1 solution (solid component concentration: 40% by mass) of Synthetic Example 1 was changed to the carboxyl group-containing photosensitive polyurethane resin U5 to U9 solutions of Synthetic Examples 5 to 9, respectively.

The thus-obtained respective laminates were subjected to the evaluations in the same manner as in Example 1. The results are shown in Table 1.

Examples 5 to 7

The respective photosensitive films, laminates, and permanent patterns of Examples 5 to 7 were produced in the same manner as in Example 2, except that the metal phosphate (trade name: OP-935, manufactured by Clariant (Japan) K.K.) was changed to the phosphazene compound (trade name: SPS-100, manufactured by Otsuka Chemical Co., Ltd.), an aromatic condensed phosphoric acid ester (trade name: CR-733S, manufactured by Daihachi Chemical Industry Co., Ltd.), or a polyphosphoric acid melamine salt (trade name: FCP-770, manufactured by Suzuhiro Industry Co., Ltd.), respectively, as described in Table 2.

The thus-obtained respective laminates were subjected to the evaluations in the same manner as in Example 2. The results are shown in Table 2.

Comparative Example 7

The photosensitive film, laminate, and permanent pattern of Comparative Example 7 were produced in the same manner as in Example 2, except that the metal phosphate (trade name: OP-935, manufactured by Clariant (Japan) K.K.) was not added.

The thus-obtained respective laminates were subjected to the evaluations in the same manner as in Example 2. The results are shown in Table 2.

Further, in Tables 1 and 2, the "C=C equivalent" means the equivalent to an ethylenically unsaturated group. "Ex. #" means Example #, "Comp. Ex. #" means Comparative Example # and "Synthetic Ex. #" means Synthetic Example #.

TABLE 1

| | Ex. 1 | Ex. 2 | Ex. 3 | Ex. 4 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|---|
| Polyurethane resin U1 solution in Synthetic Ex. 1 | 46.8 | — | — | — | — | — | — | — | — | — |
| Polyurethane resin U2 solution in Synthetic Ex. 2 | — | 46.8 | — | — | — | — | — | — | — | — |
| Polyurethane resin U3 solution in Synthetic Ex. 3 | — | — | 46.8 | — | — | — | — | — | — | — |
| Polyurethane resin U4 solution in Synthetic Ex. 4 | — | — | — | 46.8 | — | — | — | — | — | — |
| Polyurethane resin U5 solution for comparison in Synthetic Ex. 5 | — | — | — | — | 46.8 | — | — | — | — | — |
| Polyurethane resin U6 solution for comparison in Synthetic Ex. 6 | — | — | — | — | — | 46.8 | — | — | — | — |
| Polyurethane resin U7 solution for comparison in Synthetic Ex. 7 | — | — | — | — | — | — | 46.8 | — | — | — |
| Polyurethane resin U8 solution for comparison in Synthetic Ex. 8 | — | — | — | — | — | — | — | 46.8 | — | — |
| Polyurethane resin U9 solution for comparison in Synthetic Ex. 9 | — | — | — | — | — | — | — | — | 46.8 | — |
| Polyurethane resin U10 solution for comparison in Synthetic Ex. 10 | — | — | — | — | — | — | — | — | — | 46.8 |
| Metal phosphate (OP-935) | 8.4 | 8.4 | 8.4 | 8.4 | 8.4 | 8.4 | 8.4 | 8.4 | 8.4 | 8.4 |
| C=C equivalent | 0.87 | 0.65 | 0.74 | 0.74 | 0.03 | 0.55 | 1.30 | 1.10 | 0.80 | — |
| Acid value | 41.5 | 32.5 | 31.4 | 35.6 | 46.7 | 17.1 | 75.0 | 90.0 | 60.0 | — |
| Flame retardancy | ⊙ | ⊙ | ⊙ | ○ | ⊙ | ⊙ | ⊙ | ⊙ | ⊙ | x |
| Bending resistance | ⊙ | ⊙ | ⊙ | ⊙ | ⊙ | ⊙ | ○ | ○ | ○ | x |
| Resolution | ○ | ○ | Δ | Δ | x | x | Δ | Δ | x | ○ |
| Insulation reliability | ○ | ○ | Δ | Δ | x | ⊙ | x | x | x | ○ |
| Warp | ○ | ⊙ | ⊙ | ⊙ | ⊙ | ⊙ | ⊙ | ⊙ | ⊙ | x |

Note:
"—" means not added

TABLE 2

|  | Ex. 2 | Ex. 5 | Ex. 6 | Ex. 7 | Comp. Ex. 7 |
|---|---|---|---|---|---|
| Polyurethane resin U2 solution in Synthetic Ex. 2 | 46.8 | 46.8 | 46.8 | 46.8 | 46.8 |
| Metal phosphate (OP-935) | 8.4 | — | — | — | — |
| Phosphazene compound (SPS-100) | — | 8.4 | — | — | — |
| Condensed phosphorate (CR-733S) | — | — | 8.4 | — | — |
| Melamine polyphosphorate (FCP-770) | — | — | — | 8.4 | — |
| C=C equivalent | 0.65 | 0.65 | 0.65 | 0.65 | 0.65 |
| Acid value | 32.5 | 32.5 | 32.5 | 32.5 | 32.5 |
| Flame retardancy | ⊙ | ⊙ | ○ | ○ | X |
| Bending resistance | ⊙ | ⊙ | ⊙ | ○ | ⊙ |
| Resolution | ○ | Δ | ○ | ○ | ○ |
| Insulation reliability | ○ | ○ | Δ | Δ | ○ |
| Warp | ⊙ | ⊙ | ⊙ | ⊙ | ⊙ |

As is apparent from Tables 1 and 2, it can be understood that the samples according to the present invention were excellent in each of the bending resistance and the flame retardancy, and also excellent in each of the resolution, the insulation reliability, and the quite low warp, as compared to the comparative examples.

INDUSTRIAL APPLICABILITY

The photosensitive composition and photosensitive film of the invention are remarkably improved in the bending resistance and the flame retardancy, excellent in the resolution and the insulation reliability, and are also quite reduced in warp, which allow forming a highly precise permanent pattern efficiently. Thus, those can be preferably utilized, for example, in: forming various patterns, such as FPCs (flexible printing circuit boards), protective films, interlayer insulating films, and solder resist patterns; forming semiconductor packages, such as BGAs (ball grid arrays), CSPs (chip size packages), and TCPs (tape carrier packages); producing liquid crystal structural members, such as color filters, column materials, rib materials, spacers, and partitions; and producing holograms, micro machines, and proofs. In particular, those can be preferably utilized in: forming permanent patterns on printed boards; and forming semiconductor packages, such as BGAs (ball grid arrays), CSPs (chip size packages), and TCPs (tape carrier packages).

By using the photosensitive composition described above, the method of forming a permanent pattern of the present invention, can be preferably utilized, for example, in: forming semiconductor packages, such as FPCs (flexible printing circuit boards), BGAs (ball grid arrays), CSPs (chip size packages), and TCPs (tape carrier packages); forming various patterns, such as protective films, interlayer insulating films, and solder resist patterns; producing liquid crystal structural members, such as color filters, column materials, rib materials, spacers, and partitions; and producing holograms, micro machines, and proofs. In particular, the forming method can be preferably utilized in: forming permanent patterns on printed boards; and forming semiconductor packages, such as BGAs (ball grid arrays), CSPs (chip size packages), and TCPs (tape carrier packages).

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2010-194713 filed in Japan on Aug. 31, 2010, which is entirely herein incorporated by reference.

What we claim is:

1. A photosensitive composition, at least containing:
a carboxyl group-containing photosensitive polyurethane resin;
a phosphorus-containing flame retardant;
a polymerizable compound; and
a photopolymerization initiator,
wherein both a resin polymer of the carboxyl group-containing photosensitive polyurethane resin and the polymerizable compound do not contain a phosphorus atom,
wherein the carboxyl group-containing photosensitive polyurethane resin has the weight average molecular weight from 2,000 to 60,000, the acid value from 20 mg KOH/g to 120 mg KOH/g, and the ethylenically unsaturated group equivalent from 0.05 mmol/g to 3.0 mmol/g,
wherein the carboxyl group-containing photosensitive polyurethane resin has, in the side chain thereof, at least one functional group represented by any one of formulae (1) to (3):

Formula (1)

in which $R^1$ to $R^3$ each independently represent a hydrogen atom or a substituent; X represents an oxygen atom, a sulfur atom, or —N($R^{12}$)—; and $R^{12}$ represents a hydrogen atom or a substituent;

Formula (2)

in which $R^4$ to $R^8$ each independently represent a hydrogen atom or a substituent; Y represents an oxygen atom, a sulfur atom, or —N($R^{12}$)—; and $R^{12}$ has the same meaning as $R^{12}$ in formula (1); and

Formula (3)

in which $R^9$ to $R^{11}$ each independently represent a hydrogen atom or a substituent; Z represents an oxygen atom, a sulfur atom, —N($R^{13}$)—, or a phenylene group which may have a substituent; and $R^{13}$ represents an alkyl group which may have a substituent; and
wherein the at least one functional group represented by any one of formulae (1) to (3) does not link to a carbonyloxy-aliphatic group A (*) in a partial structure of the side chain, which partial structure links the group of any one of formulae (1) to (3) to the main chain of said polyurethane at the X, Y, or Z side, said carbonyloxy-aliphatic group A having a hydroxyl group or an acyloxy group substituted at the β position or γ position to the X, Y, or Z in an aliphatic moiety of the carbonyloxy-aliphatic group A and being linked to the structure of any one of formulae (1) to (3) which exists at the aliphatic moiety side (*) in the carbonyloxy-aliphatic group A.

2. The photosensitive composition according to claim 1, wherein the carboxyl group-containing photosensitive polyurethane resin is a reaction product of a diisocyanate compound and a diol compound, and the diol compound is a mixture of (i) at least one diol compound having an ethylenically unsaturated group in which at least one hydroxyl group is a secondary alcohol and the remaining hydroxyl group is a primary or a tertiary alcohol, and (ii) at least one diol compound having a carboxyl group.

3. The photosensitive composition according to claim 2, wherein the diol compound having an ethylenically unsaturated group has a hydroxyl group of primary alcohol and a hydroxyl group of secondary alcohol, as a hydroxyl group which is allowed to react with an isocyanate group.

4. The photosensitive composition according to claim 2, wherein the diol compound having an ethylenically unsaturated group is a compound represented by formula (G):

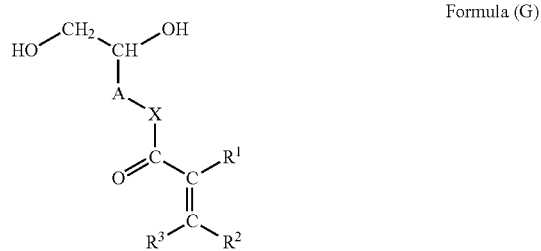

Formula (G)

wherein $R^1$ to $R^3$ each independently represent a hydrogen atom or a substituent; A represents a divalent organic residue; X represents an oxygen atom, a sulfur atom, or —N($R^{12}$)—; and $R^{12}$ represents a hydrogen atom or a substituent.

5. The photosensitive composition according to claim 2, wherein the diisocyanate compound is an aromatic compound.

6. The photosensitive composition according to claim 2, wherein the diisocyanate compound is a diisocyanate compound having a skeleton of bisphenol A type, bisphenol F type, biphenyl type, naphthalene type, phenanthrene type, or anthracene type.

7. The photosensitive composition according to claim 1, wherein the phosphorus-containing flame retardant is any one of condensed phosphoric acid compound, polyphosphoric melamine salt, phosphazene compound, and metal phosphate.

8. The photosensitive composition described according to claim 1, which contains a thermo-crosslinking agent.

9. The photosensitive composition according to claim 8, wherein the thermo-crosslinking agent is at least one selected from the group consisting of an epoxy compound, an oxetane compound, a polyisocyanate compound, a compound obtained by a reaction of a polyisocyanate compound with a blocking agent, and a melamine derivative.

10. A photosensitive film, having a photosensitive layer containing the photosensitive composition according to claim 1, on a support.

11. A photosensitive laminate, having:
a substrate; and
a photosensitive layer containing the photosensitive composition according to claim 1, provided on the substrate.

12. A method of forming a permanent pattern, at least comprising:
exposing a photosensitive layer formed with the photosensitive composition according to claim 1, to light.

13. A printed board, which has a permanent pattern formed according to the method of forming a permanent pattern according to claim 12.

* * * * *